United States Patent
Shu

(10) Patent No.: US 9,787,316 B2
(45) Date of Patent: Oct. 10, 2017

(54) SYSTEM FOR CONVERSION BETWEEN ANALOG DOMAIN AND DIGITAL DOMAIN WITH MISMATCH ERROR SHAPING

(71) Applicant: MEDIATEK Inc., Hsin-Chu (TW)

(72) Inventor: Yun-Shiang Shu, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/246,580

(22) Filed: Aug. 25, 2016

(65) Prior Publication Data

US 2017/0077937 A1    Mar. 16, 2017

Related U.S. Application Data

(60) Provisional application No. 62/218,053, filed on Sep. 14, 2015.

(51) Int. Cl.

| | | |
|---|---|---|
| H03M 1/66 | (2006.01) | |
| H03M 1/06 | (2006.01) | |
| H03M 3/00 | (2006.01) | |
| H03M 1/14 | (2006.01) | |
| H03M 1/68 | (2006.01) | |

(52) U.S. Cl.
CPC ......... *H03M 1/0673* (2013.01); *H03M 3/338* (2013.01); *H03M 3/344* (2013.01); *H03M 1/145* (2013.01); *H03M 1/68* (2013.01)

(58) Field of Classification Search
CPC .... H03M 3/502; H03M 3/464; H03M 1/0665; H03M 1/66; H03M 3/504; H03M 1/0673; H03M 1/00; H03M 1/0614; H03M 1/0663; H03M 1/0854

USPC .......................... 341/118–120, 143, 144, 145
See application file for complete search history.

(56) References Cited

U.S. PATENT DOCUMENTS 4,857,927 A * 8/1989 Takabayashi ....... H03M 1/0639
                                                              341/131
5,818,372 A * 10/1998 Noro .................... H03M 1/0641
                                                              341/118

(Continued)

OTHER PUBLICATIONS

Shui, et al.: Mismatch-Shaping BAC for Lowpass and Band ass Multi-Bit Delta-Sigma Modulators; 0-7803-4455-3/98/$10.00 copyright 1998 IEEE; pp. 352-355.

(Continued)

*Primary Examiner* — Linh Nguyen
(74) *Attorney, Agent, or Firm* — McClure, Qualey & Rodack, LLP

(57) ABSTRACT

The invention provides a system for conversion between analog domain and digital domain with mismatch error shaping, including a DAC, a first injection circuit coupled to the DAC, and a second injection circuit coupled to the DAC. The DAC generates a first analog value in response to a first digital value, and generates a second analog value in response to a second digital value. The first injection circuit enables an analog injection value to be injected to the second analog value when the DAC generates the second analog value, wherein the analog injection value is converted from a digital injection value formed by a subset of bits of the first digital value. The second injection circuit injects the digital injection value to the second digital value, or combines the digital injection value and a related value obtained according to the second analog value.

12 Claims, 20 Drawing Sheets

(56) References Cited

U.S. PATENT DOCUMENTS

| | | | | |
|---|---|---|---|---|
| 5,977,899 | A * | 11/1999 | Adams | H03M 3/50 341/143 |
| 5,982,317 | A * | 11/1999 | Steensgaard-Madsen | H03M 1/067 341/143 |
| 6,137,430 | A * | 10/2000 | Lyden | H03M 1/069 341/144 |
| 7,916,058 | B1 * | 3/2011 | Balachandran | H03M 1/0665 341/118 |
| 2003/0112166 | A1 * | 6/2003 | Al-Awadhi | H03M 3/50 341/143 |
| 2007/0018869 | A1 * | 1/2007 | Luecking | H03M 1/0668 341/143 |
| 2008/0100487 | A1 * | 5/2008 | Tsai | H03M 1/0614 341/144 |
| 2008/0258949 | A1 * | 10/2008 | Galton | H03M 1/1004 341/120 |
| 2011/0148678 | A1 * | 6/2011 | Hu | H03M 1/0668 341/143 |
| 2012/0086590 | A1 * | 4/2012 | Satarzadeh | H03M 3/38 341/120 |

OTHER PUBLICATIONS

Shu, et al.: "An Oversampling SAR ADC with DAC Mismatch Error Shaping Achieving 105dB SFDR and 101dB SNDR over 1kHz BW in 55nm CMOS"; ISSCC 2016 / Session 27 / Hybrid and Nyquist Data Converters / 27.2; pp. 1-3.

Adams, et al.: "A 113-dB SNR Oversampling DAC with Segmented Noise-Shaped Scrambling"; IEEE Journal of Solid-State Circuits, vol. 33, No. 12, Dec. 1998; pp. 1871-1878.

Nguyen, et al.: "A 108 dB SNR, 1.1 mW Oversampling Audio DAC With a Three-level DEM Technique"; IEEE Journal of Solid-State Circuits, vol. 43, No. 12, Dec. 2008; pp. 2592-2600.

* cited by examiner

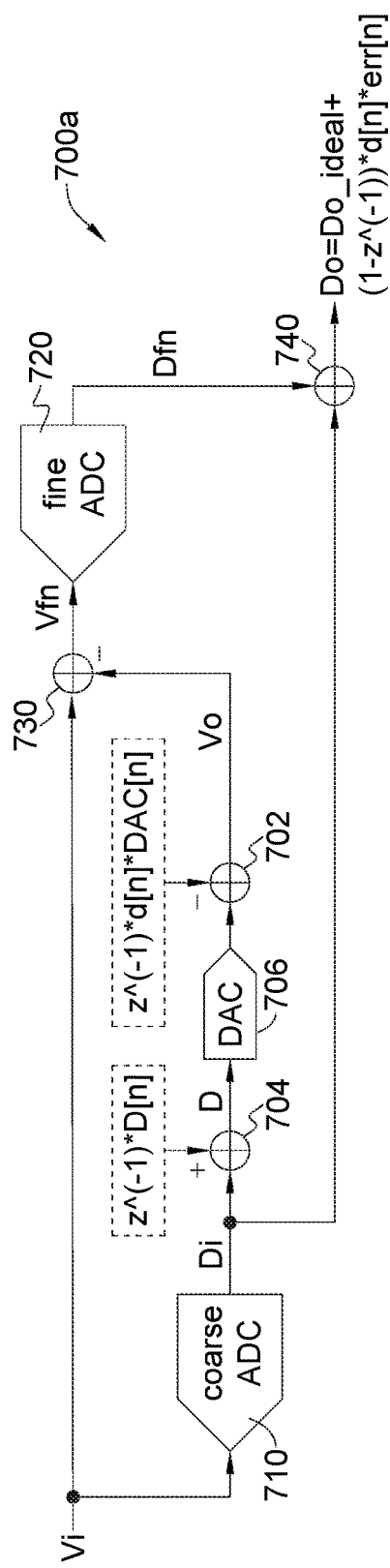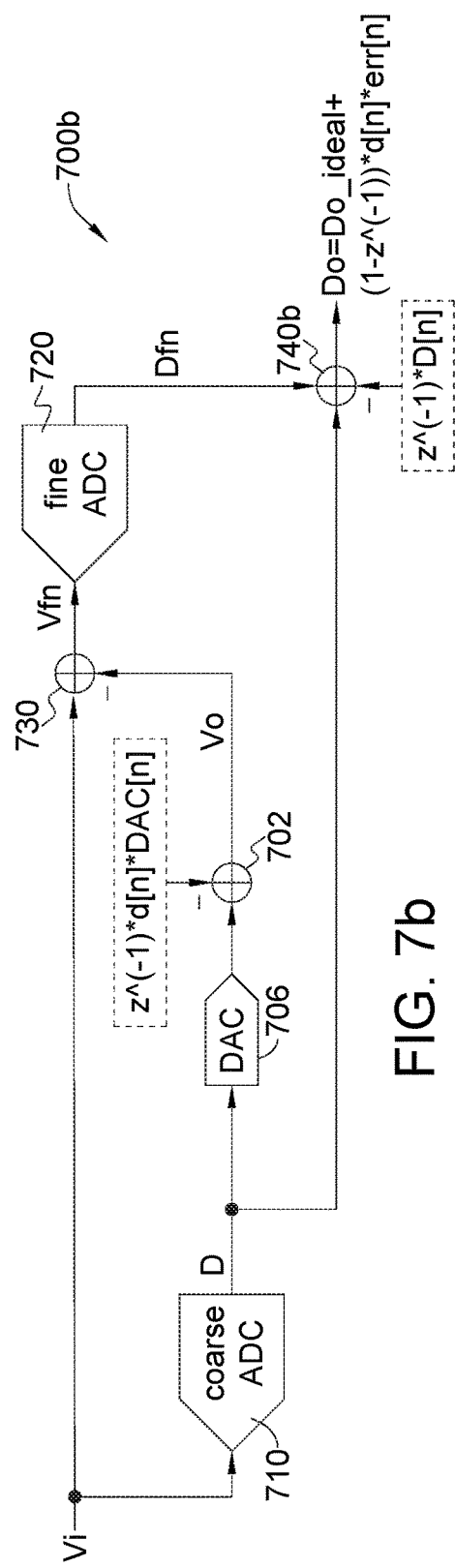
FIG. 7a
FIG. 7b

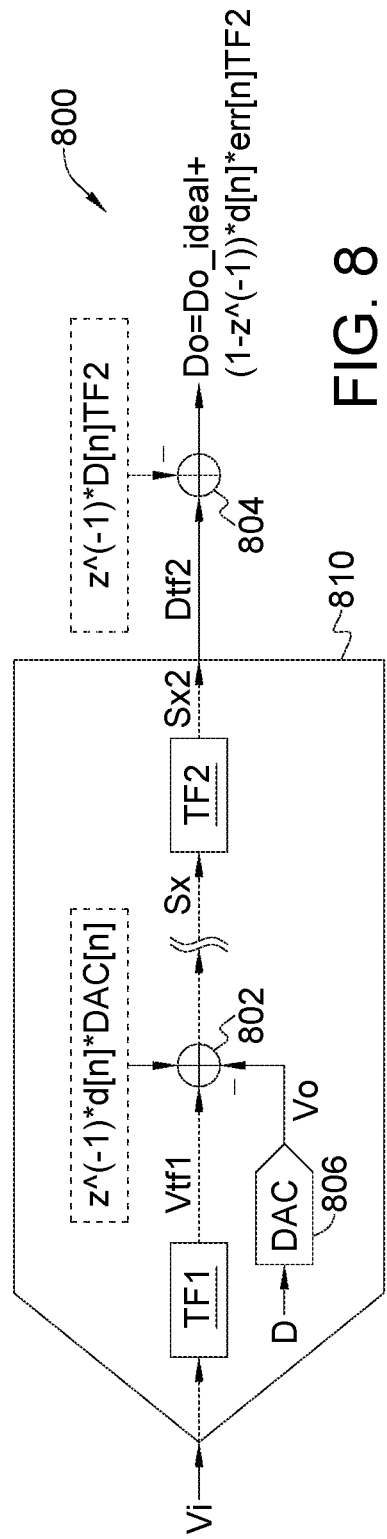

US 9,787,316 B2

SYSTEM FOR CONVERSION BETWEEN ANALOG DOMAIN AND DIGITAL DOMAIN WITH MISMATCH ERROR SHAPING

This application claims the benefit of U.S. provisional application Ser. No. 62/218,053, filed Sep. 14, 2015, the subject matter of which is incorporated herein by reference.

FIELD OF THE INVENTION

The present invention relates to a system for conversion between analog domain and digital domain with mismatch error shaping (MES), and more particularly, to a system implementing MES by injections of previous values in analog and digital domains.

BACKGROUND OF THE INVENTION

Semiconductor circuitry system with functionality of conversion between digital and analog domains is essential for modern electronic, e.g., mobile phone, notebook/tablet computer, digital camera/camcorder, navigation system, etc.

For converting a digital input to an analog output, a DAC (digital-to-analog converter) selectively activates a subset of a plurality of conversion elements (e.g., resistors, capacitors or current sources, etc.) according to value of the digital input, so as to synthesize the analog output. However, the plurality of conversion elements suffer deviations (e.g., variations) from their expected values, and therefore introduce mismatch error during conversion. Some kinds of ADCs (analog-to-digital converters) also adopt conversion elements and/or utilize internal DACs to perform analog-to-digital conversion. Therefore, suppressing mismatch error is important for both DAC and ADC.

Please refer to FIG. 1 illustrating a prior art DAC system 100 which converts a digital input Di of (Ma+Mb) bits to an analog output Vop. The DAC system 100 includes a digital first-order modulator 102 (e.g., a sigma-delta modulator), two DEM (dynamic element matching) circuits 104a and 104b, and two DACs 106a and 106b. The digital first-order modulator 102 modulates the digital input Di to a digital signal Da of Ma bits, and the digital signal Da includes the digital input Di and the quantization error of the digital modulator 102. The DAC 106a includes a plurality of equal weighted conversion elements (not shown) for converting the digital signal Da to an analog signal Va. During conversion of the digital signal Da, the digital signal Da is coded from binary code to thermometer code, and the DEM circuit 104a selects a number of the conversion elements of the DAC 106a with the number determined according to the digital value Da, so the DAC 106a generates the analog signal Va by the selected conversion elements.

On the other hand, the digital signal Da is subtracted from the digital input Di to form another digital signal Db, and the digital signal Db reflects the quantization error of the digital modulator 102. The DAC 106b includes a plurality of equal weighted conversion elements (not shown) for converting the digital signal Db to an analog signal Vb. During conversion of the digital signal Db, the digital signal Db is coded from binary code to thermometer code, and the DEM circuit 104b selects a number of the conversion elements of the DAC 106b with the number determined according to the digital value Db, so the DAC 106b generates the analog signal Vb by the selected conversion elements. The analog signal Vb is subtracted from the analog signal Va to form the analog output Vop.

The DAC system 100 has some disadvantages. To convert the digital input Di, the DAC system 100 needs to concurrently receive all bits of the digital input Di. The DAC system 100 is therefore not applicable for successive bit-by-bit digital-to-analog conversion, such as the DAC utilized in SAR (successive approximation register) ADC. In addition, the DAC system 100 suffers delay caused by the digital first-order modulator 102. Consequently, the DAC system 100 is not applicable for fast conversion, such as CT-DSM (continuous time delta sigma modulator).

SUMMARY OF THE INVENTION

An objective of the invention is providing a system (e.g., 600, 700a, 700b, 800, 900, 1200, 1500, 1600, 1800 or 1900 in FIG. 6b, 7a, 7b, 8, 9, 12, 15, 16, 18 or 19) for conversion between analog domain and digital domain with MES; the system may include a DAC (e.g., 606, 706, 806, 906, 1206, 1506, 1606a/1606b or 1906), a first injection circuit (e.g., 602, 702, 802, 902, 1202, 1502, 1602 or 1902) and a second injection circuit (e.g., 604, 704/740b, 804, 904, 1204, 1504, 1604 or 1904). The DAC generates a first analog value in response to a first digital value (e.g., D' in FIG. 6b), and generates a second analog value (e.g., Vo in FIG. 6b or 7b) in response to a second digital value (e.g., D in FIG. 6b or 7b). The first injection circuit is coupled to the DAC, and enables an analog injection value (e.g., $z^{\wedge}(-1)*d[n]*DAC[n]$ in FIG. 6b or 7b) to be injected to the second analog value, wherein the analog injection value is converted from a digital injection value (e.g., $z^{\wedge}(-1)*D[n]$ in FIG. 6b or 7b) formed by a subset of bits of the first digital value. The second injection circuit is coupled to the DAC, for one of the following: (i) injecting the digital injection value to the second digital value (e.g., D in FIG. 6b), and (ii) combining the digital injection value and a related value (e.g., Dfn in FIG. 7b) obtained according to the second analog value.

In an embodiment (e.g., FIG. 7a or 7b), the system (700a or 700b) may further include a first ADC (e.g., 710), a first sum block (e.g., 730), a second ADC (e.g., 720) and a second sum block (e.g., 740 or 740b). The first ADC converts an input analog value (e.g., Vi) to a converted input digital value (e.g., Di or D in FIG. 7a or 7b). The first sum block is coupled between the input analog value and the DAC for subtracting the second analog value (e.g., Vo) from the input analog value to form an internal analog value (e.g., Vfn). The second ADC is coupled to the first sum block for converting the internal analog value to an internal digital value (e.g., Dfn). The second sum block is coupled to the first ADC and the second ADC for combining the second digital value and the internal digital value. In an embodiment (e.g., FIG. 7a), the second injection circuit (e.g., 704) is coupled between the first ADC and the DAC, and is arranged to inject the digital injection value to the second digital value by combining the converted input digital value and the digital injection value to form the second digital value. In an embodiment (e.g., FIG. 7b), the second digital value is the converted input digital value, the second injection circuit is arranged to combine the digital injection value and the related value which is the internal digital value, and the second injection circuits is implemented by the second sum block (e.g., 740b).

In an embodiment (e.g., FIGS. 9 to 10 or FIGS. 12 to 13b), the system receives a first input analog value (e.g., Vi' in FIG. 10 or 13a/13b) and outputs a first output digital value (e.g., Do' or Dop' in FIG. 10 or 13a/13b) converted from the first input analog value during a first cycle (e.g., 1000' or 1300'), and receives a second input analog value (e.g., Vi)

and outputs a second output digital value (e.g., D or Dop in FIG. 9 or 12) converted from the second input analog value during a second cycle (e.g., 1000 or 1300), wherein the subset of bits (e.g., {d'[N−1], . . . , d'[0]}) of the first digital value (e.g., D' in FIG. 10 or 13a) is extracted from the first output digital value; the system further comprises a register (e.g., 940 or 1240), the first injection circuit comprises an additional control circuit (e.g., 950 or 1250) coupled to the register, and the DAC comprises a peripheral circuit (e.g., 930 or 1230) coupled to the register, and a plurality of capacitors (e.g., c[N] to c[0]). Each of the capacitors has a top terminal coupled to a common node (e.g., nz1 or nz2), and a bottom terminal coupled to the peripheral circuit. During a first phase (e.g., 1002a or 1302a) of the second cycle, the additional control circuit controls the register to register the subset of bits of the first digital value, and controls the peripheral circuit to conduct the bottom terminals of the capacitors to voltages (e.g., −d'[n]*Vr) reflecting the subset of bits of the first digital value, and to conduct the common node to the second input analog value, so as to enable the analog injection value to be injected. During a second phase (e.g., 1002b or 1302b) of the second cycle after the first phase, the peripheral circuit conducts the bottom terminals of the capacitors to a reset voltage (e.g., V0), and the register resets. The system further includes a comparator (e.g., 910 or 1210) coupled to the common node and the register, wherein during a period (e.g., p[n] in FIG. 10 or 13b) of the second cycle, the comparator compares a voltage (e.g., Vz1 or Vz2) at the common node to set a bit (e.g., b[n]) of the register.

In an embodiment (e.g., FIG. 12 to 13a/13b), the system further comprises a second register (e.g., 1290), a DEM circuit (e.g., 1280) coupled to the second register, a second peripheral circuit (e.g., 1270) coupled to the DEM circuit, and a plurality of second capacitors (e.g., ca[Q] to ca[1]). Each of the second capacitors having a top terminal coupled to the common node, and a bottom terminal coupled to the peripheral circuit. During the first phase and the second phase of the second cycle, the second peripheral circuit conducts the bottom terminals of the second capacitors to the reset voltage. During a third phase (e.g., 1304) of the second cycle, the DEM circuit selects a number (e.g., S[m] in FIG. 13b) of the second capacitors with the number reflecting bits registered by the second register, and the second peripheral circuit conducts the bottom terminals of the selected second capacitors to a setting voltage (e.g., −Vr).

In an embodiment (e.g., FIG. 15), the DAC (e.g., 1506) generates the first analog value during a first cycle, and generates the second analog value (e.g., Vo) during a second cycle; the first injection circuit sequentially loads the digital injection value (e.g., −z^(−1)*D) and the second digital value (e.g., D) to the DAC during different periods of the second cycle, so as to enable the analog injection value to be injected. The system receives an input digital value (e.g., Di) and outputs an output analog value (e.g., Vot) during the second cycle, wherein the second digital value is formed by a second subset of the bits (e.g., the least significant Ns bits) of the input digital value, and the system further includes a second DAC (e.g., 1520), a DEM circuit (e.g., 1510) and a sum block (e.g., 1530). The DEM circuit is coupled between the second injection circuit and the second DAC, for receiving an internal digital value (e.g., H) formed by a first subset of bits (e.g., the most significant Ms bits) of the digital input value, decoding the internal digital value from binary code to thermometer code, and accordingly controlling the second DAC to synthesize an internal analog value (e.g., VoH). The sum block (e.g., 1530) is coupled between the DAC and the second DAC for combining the internal analog value and the second analog value to form the output analog value.

In an embodiment (e.g., FIG. 17a), besides the DAC (e.g., 1606b), the system further includes a second DAC (e.g., 1606a), wherein the analog injection value is converted by the second DAC. In an embodiment (e.g., FIGS. 16-17b or FIG. 18), besides the DAC (e.g., 1606b), the system further includes a second DAC (e.g., 1606a in FIG. 16) coupled to the first injection circuit (e.g., 1602), and a sum block (e.g., 1660) coupled to the DAC and the second DAC. The first injection circuit includes an operator (e.g., u1) coupled between a first port (e.g., p1) and a second port (e.g., p2). During a first cycle (e.g., FIG. 17a), the operator provides the digital injection value (e.g., −D(k−1)) via the second port, the second digital value (e.g., D(k)) is received via the first port, the first injection circuit routes the second port to the second DAC to convert the digital injection value to the analog injection value (e.g., va(k)), and routes the first port to the DAC to convert the second digital value to the second analog value (e.g., vb(k)), so as to enable the analog injection value to be injected to the second analog value by the sum block which combines the analog injection value and the second analog value.

During a second cycle (e.g., FIG. 17b), the operator provides a second digital injection value (e.g., −D(k)) via the second port, a subsequent digital value (e.g., D(k+1)) is received via the first port, the first injection circuit routes the second port to the DAC to convert the second digital injection value to a second analog injection value (e.g., vb(k+1)), and routes the first port to the second DAC to convert the subsequent digital value to a subsequent analog value (e.g., va(k+1)), so as to enable the second analog injection value to be injected to the subsequent analog value by the sum block which combines the second analog injection value and the subsequent analog value, wherein the second digital injection value is formed by a subset of bits of the second digital value.

In an embodiment (e.g., FIG. 16 or 18), the system further includes a third DAC (e.g., 1620) coupled to the sum block (e.g., 1660) with the sum block coupled to the DAC (e.g., 1606b), the second DAC (e.g., 1606a) and the third DAC; and a DEM circuit (e.g., 1610) coupled to the third DAC for receiving an internal digital value (e.g., H or DoM in FIG. 16 or 18), coding the internal digital value from binary code to thermometer code, and accordingly controlling the third DAC to synthesize an internal analog value (e.g., VH). The internal digital value and the second digital value (e.g., D or DoL in FIG. 16 or 18) are respectively formed by different subsets of bits of a third digital value (e.g., Ds or Do in FIG. 16 or 18), and the sum block combines the analog injection value, the second analog value and the internal analog value to form a third analog value (e.g., Vo). The system, which may implement a delta-sigma modulator, receives an input analog value (e.g., Vi) and outputs an output digital value (e.g., Do or Dop in FIG. 16 or 18) converted from the input analog value, and further includes a loop filter (e.g., 1640) and an ADC (e.g., 1650). The loop filter is coupled to the sum block, for filtering a difference (e.g., Vd) between the input analog value and the third analog value to generate a filtered analog value (e.g., Vf). In an embodiment (e.g., FIG. 16), the ADC is coupled between the loop filter and the second injection circuit (e.g., 1604) for converting the filtered analog value to the output digital value (e.g., Do), wherein the second injection circuit (e.g., 1604) is arranged to combine the digital injection value and the related value, which is the output digital value, to form the third digital value (e.g., Ds). In an embodiment (e.g., FIG. 18), the ADC converts the filtered analog value to the third digital value (e.g., Do), wherein the second injection circuit (e.g., 1804) is arranged to combine the digital injection value and the related value, which is the third digital value, to form the output digital value (e.g., Dop).

In an embodiment (e.g., FIG. 18), the ADC includes an inner injection circuit (e.g., 1802) for combining the digital injection value (e.g., $z\hat{}(-1)*$DoL) and the second digital value (e.g., DoL), an inner DAC (e.g., 1806) coupled to the inner injection circuit for converting the combined result of the inner injection circuit, and a second inner DAC (e.g., 1810) for converting the internal digital value (e.g., DoM). The inner injection circuit and the second injection circuit combine the digital injection value with different signs (e.g., one plus and one minus).

In an embodiment (e.g., FIG. 19), wherein the DAC generates the first analog value in response to the first digital value during a first cycle, and generates the second analog value in response to the second digital value during a second cycle, wherein the first cycle is previous to the second cycle by a number (e.g., K) of cycles, and the number is equal to or greater than one.

In an embodiment (e.g., FIG. 8), the system (e.g., 800) receives an input analog value (e.g., Vi) and outputs an output digital value (e.g., Do) converted from the input analog value, and further include a processing block (e.g., TF2) coupled to the DAC (e.g., 806). Wherein the second injection circuit is arranged to combine the related value (e.g., Dtf2) and the digital injection value processed by the processing block to form the output digital value, the processing block (e.g., TF2) processes an inner value (e.g., Sx) to form a second inner value (e.g., Sx2), the related value (e.g., Dtf2) reflects the second inner value, the second digital value (e.g., D) reflects the input analog value, and the inner value reflects the second analog value (e.g., Vo).

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 6b illustrates a system according to an embodiment of the invention for MES of the DAC shown in FIG. 6a;

FIG. 7a and FIG. 7b illustrate systems according to embodiments of the invention;

FIG. 8 illustrates a system according to an embodiment of the invention;

DETAILED DESCRIPTION OF PREFERRED EMBODIMENTS

Figure 2:
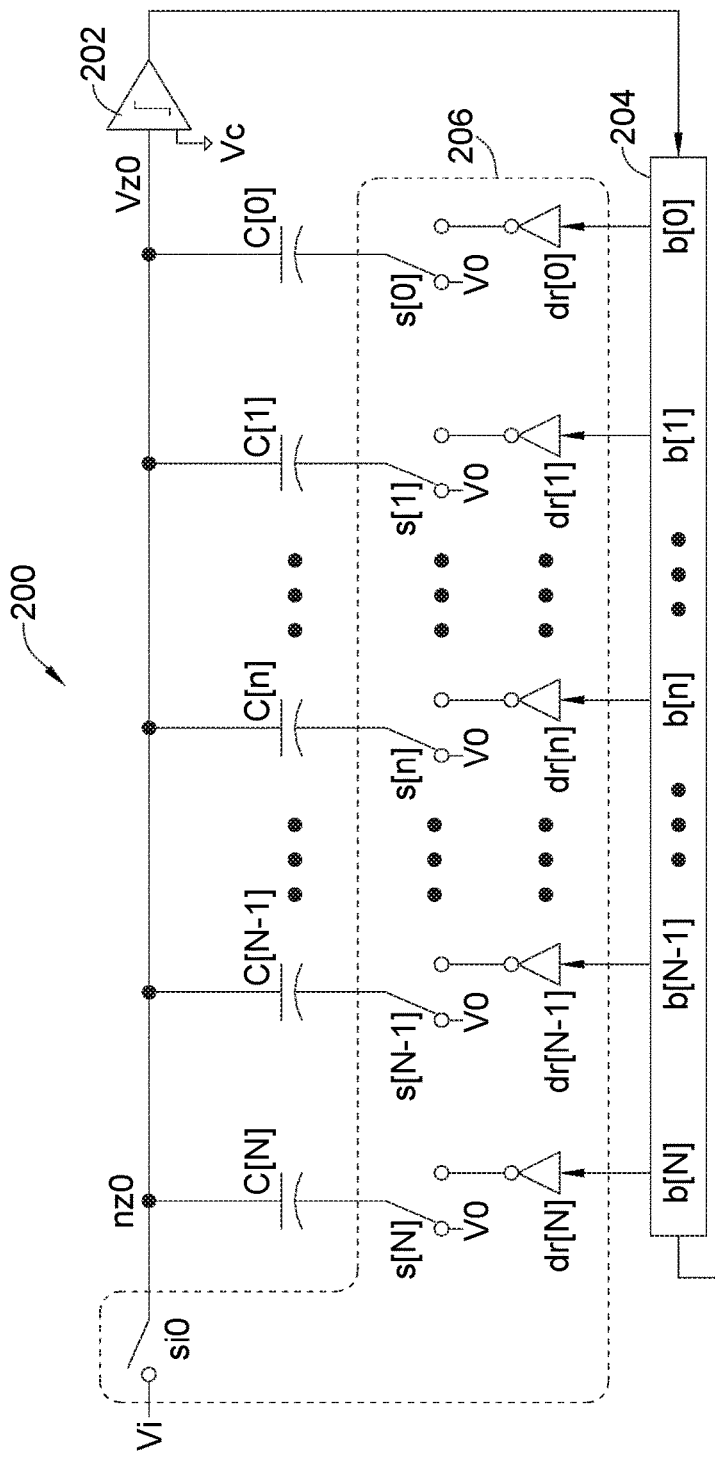
FIG. 2 (prior art) illustrates a prior art ADC system.
Figure 3:
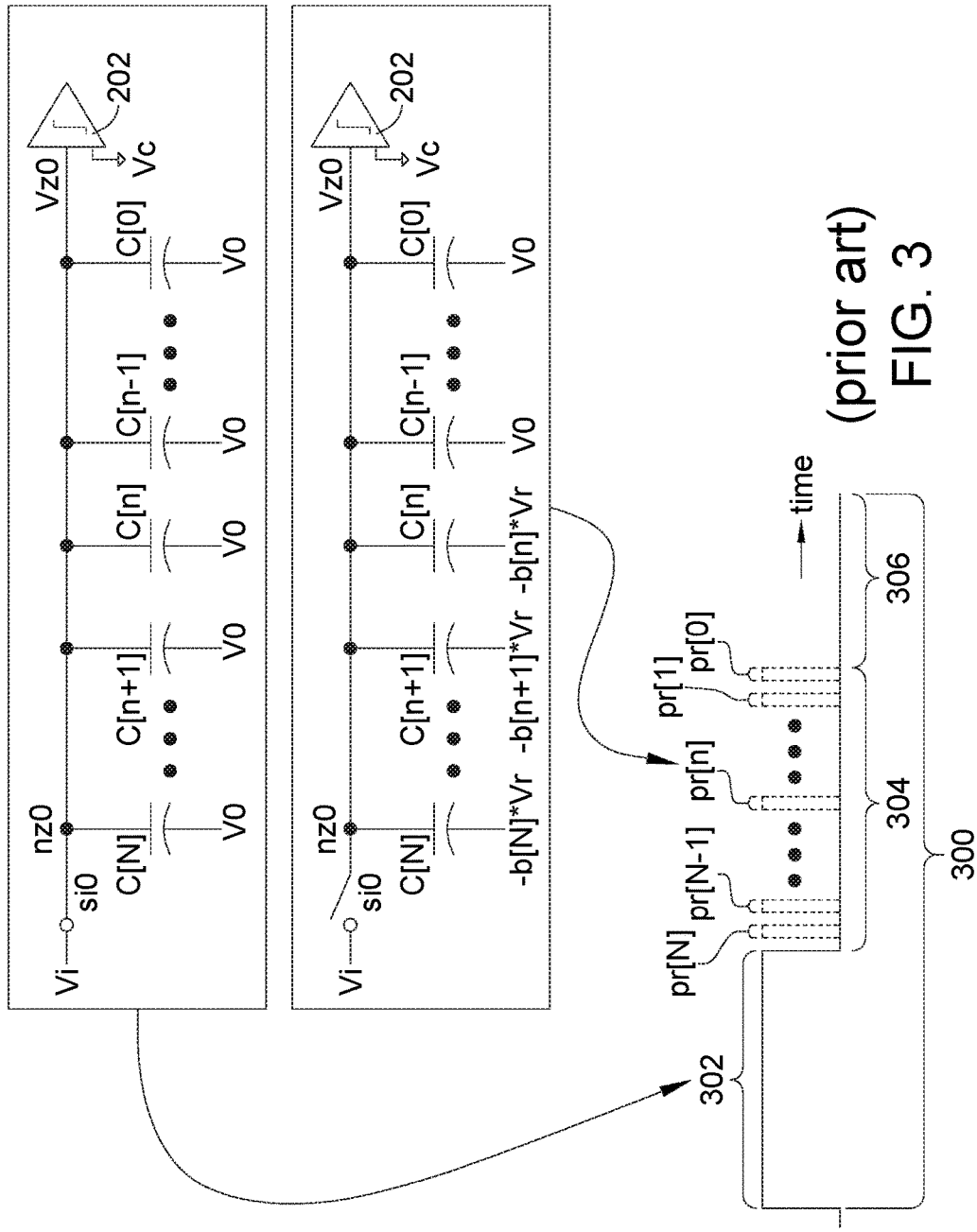
FIG. 3 (prior art) illustrates operations of the system shown in FIG. 2.

Please refer to FIGS. 2 and 3. FIG. 2 illustrates a system 200 which implements a SAR ADC for converting an analog value Vi to a digital value Do, and FIG. 3 illustrates operations of the system 200. The system 200 may include a comparator 202, a register 204, a peripheral circuit 206 and an array of capacitors C[N], C[N−1], . . . , C[1] and C[0]. The peripheral circuit 206 includes a switch si0, a plurality of switches s[N], s[N−1], . . . , s[1] and s[0], and a plurality of bias circuits dr[N], dr[N−1], . . . , dr[1] and dr[0]. The switch si0 is coupled between the analog value Vi and a node nz0. The comparator 202 is coupled to the node nz0, and capable of comparing if a voltage Vz0 at the node nz0 is greater than a voltage Vc. Each capacitor C[n] (for n=N, N−1, . . . to 0) has a top terminal coupled to the node nz0, and a bottom terminal coupled to the switch s[n] to be selectively conducted to a constant reset voltage V0 (e.g., a ground level) or the bias circuit dr[n]. The register 204 registers bits b[N], b[N−1], . . . , b[1] and b[0], each bit b[n] may equal 1 or the opposite. Each bias circuit dr[n] provides a voltage −b[n]*Vr according to the bit b[n].

The system 200 spends a cycle 300 to convert the analog value Vi to the digital value Do, as shown in FIG. 3. The cycle 300 includes a sample phase 302, a comparison phase 304 and a spare phase 306 (some designs may not have the spare phase). During the sample phase 302, the switch si0 conducts the analog value to the node nz0, and each switch s[n] conducts the bottom terminal of each capacitor c[n] to the voltage V0. During the comparison phase 304, the switch si0 stops conducting the analog value Vi to the node nz0. The comparison phase 304 includes a plurality of bit-decision periods pr[N], pr[N−1], . . . , pr[1] and pr[0]. After phase 302 and before the period pr[N], the comparator 202 compares whether the voltage Vz is greater than the voltage Vc to determine whether the bit b[N] is 1 or the opposite. During the period pr[N], the switch s[N] switches to the bias circuit dr[N] which provides a setting voltage −b[N]*Vr, while the rest switches s[N−1] to s[0] remain conducting to the voltage V0, such that the voltage Vz0 at the node nz0 reflects a value Vi−b[N]*Vr*C[N]/Ct, with Ct reflecting a total capacitance of the capacitors C[N] to C[0]. The comparator 202 compares whether the voltage Vz0 is greater than the voltage Vc to determine whether the bit b[N−1] equals 1 or the opposite.

Once the bit b[N−1] is determined, the system 200 proceeds to the next period pr[N−1]. During the period pr[N−1], the switch s[N−1] switch to the bias circuits dr[N−1] which provides a voltage −b[N−1]*Vr, while the rest switches s[N−2] to s[0] remain conducting to the voltage V0, so the voltage Vz0 reflects a value Vi−Vr*(b[N]*C[N]+b[N−1]*C[N−1])/Ct. The comparator 202 compares whether the voltage Vz0 is greater than the voltage Vc to determine whether the bit b[N−2] equals 1 or the opposite.

As shown in FIG. 3, after the bits b[N−1], b[N−2] to b[n] are successively determined respectively after the periods pr[N], pr[N−1] to pr[n+1], at the period pr[n], the switches s[N] to s[n] respectively switch to the bias circuits dr[N] to dr[n] which respectively provide voltages −b[N]*Vr, . . . , −b[n+1]*Vr and −b[n]*Vr, while the rest switches s[n−1] to s[0] remain conducting to the voltage V0, so the voltage Vz0 reflects a value Vi−Vr*(b[N]*C[N]+b[N−1]*C[N−1]+ . . . +b[n+1]*C[n+1]+b[n]*C[n])/Ct. The comparator 202 compares whether the voltage Vz0 is greater than the voltage Vc to determine whether the bit b[n−1] is 1. After periods pr[N] to pr[0], all the bits b[N] to b[0] are determined to be outputted as bits of the digital value Do during the spare phase 306.

Ideally, capacitances of the capacitors C[N] to C[0] are binary weighted, i.e., a ratio of capacitances of the capacitors C[N], C[N−1], . . . , C[n], . . . , C[1] and C[0] are expected to equal $2^N:2^{(N-1)}: \ldots :2^n: \ldots :2^1:2^0$. For example, the ideal capacitance ratio is 512:256:128: . . . :2:1 assuming N=9. With the ideal capacitance ratio, the bits b[N] to b[0] determined respectively during the periods pr[N] to pr[0] will expand the analog value Vi to a sum $b[N]*2^N+b[N-1]*2^{(N-1)}+ \ldots +b[n]*2^n+ \ldots +b[1]*2^1+b[0]*2^0$. Thus, the analog value Vi is converted to the digital value Do={b[N], b[N−1], . . . , b[0]}, with the bits b[N] to b[0] being the bits of the digital value Do, from MSB to LSB.

During the comparison phase 304, the peripheral circuit 206 and the capacitors C[N] to C[0] collectively work as a DAC 210, since the determined bits b[N] to b[n+1] are converted to the voltage Vz0 during the period pr[n]. Therefore, after the periods pr[N] to pr[0], the digital value Do may be expressed as a sum b[N]*w[N]+b[N−1]*w[N−1]+ . . . +b[n]*w[n]+ . . . +b[1]*w[1]+b[0]*w[0], wherein w[N], w[N−1], . . . , w[n], . . . w[1] and w[0] are weightings respectively associated with the capacitances of the capacitors C[N], C[N−1], . . . , C[n], . . . , C[1] and C[0]. In other words, each analog value b[n]*Vr*C[n]/Ct corresponds to a digital value b[n]*w[n]. For an ideal binary digitization, the weightings w[N], . . . , w[n], . . . , w[0] should equal $2^N, \ldots , 2^n, \ldots , 2^0$.

Figure 4:
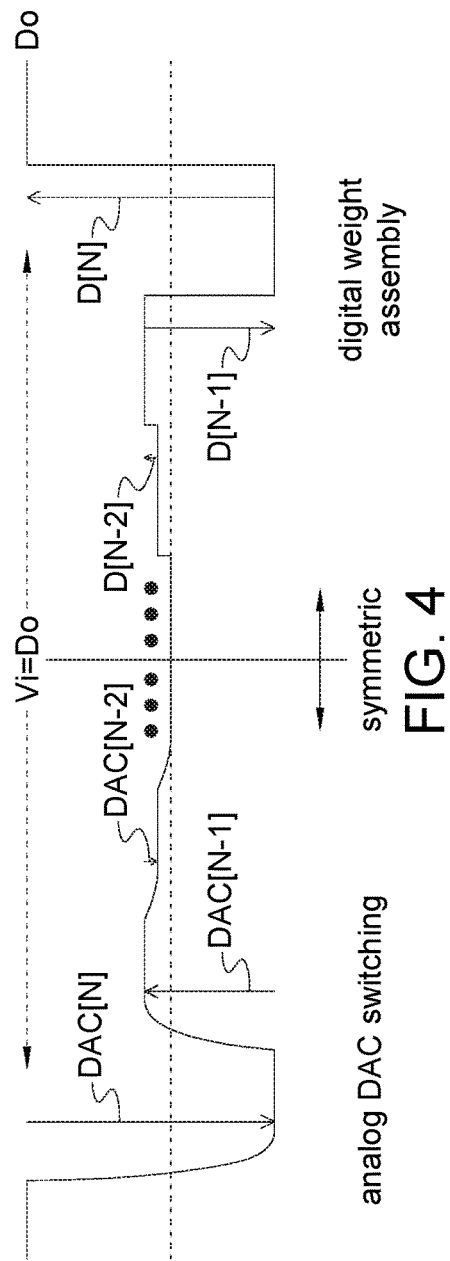
FIG. 4 illustrates conversion between analog and digital domains.

Practical capacitances of the capacitors C[N] to C[0] deviate from the ideal capacitance ratio, and consequently cause mismatch error. Please refer to FIG. 4 which uses the system 200 in FIG. 2 as an example to illustrate the concept to address the mismatch issues according to the invention. The left-hand side of FIG. 4 depicts successively approximating the input analog value Vi by sequentially subtracting analog values DAC[N], DAC[N−1], DAC[N−2], . . . from the analog value Vi, with DAC[n] being an analog value generated for the bit b[n] by the DAC 210. For example, the analog values DAC[N], DAC[N−1] and DAC[N−2] may respectively equal Vr*b[N]*C[N]/Ct, Vr*b[N−1]*C[N]Ct and Vr*b[N−2]*C[N−2]/Ct in the system 200 of FIG. 2. On the other hand, the right-hand side of FIG. 4 depicts successively constructing the output digital value Do by sequentially adding digital values such as D[N−2], D[N−1] and D[N] respectively equal to b[N−2]*w[N−2], b[N−1]*w[N−1] and b[N]*w[N] in the system 200 of FIG. 2.

While prior arts attempt to address the mismatch issues solely in digital domain or in analog domain, the invention addresses the mismatch issues symmetrically in both analog domain and digital domain. For example, assuming the capacitor C[N−2] suffers a deviation from its expected (ideal) capacitance, if the digital weighting w[N−2] has a symmetric deviation from the ideal weighting $2^{(N-2)}$, than the analog value Vi can still be perfectly converted to correct digital value Do without error. In other words, according to the invention, the mismatch issues may be addressed by symmetrically compensating both in the analog and digital domains.

Figure 5:
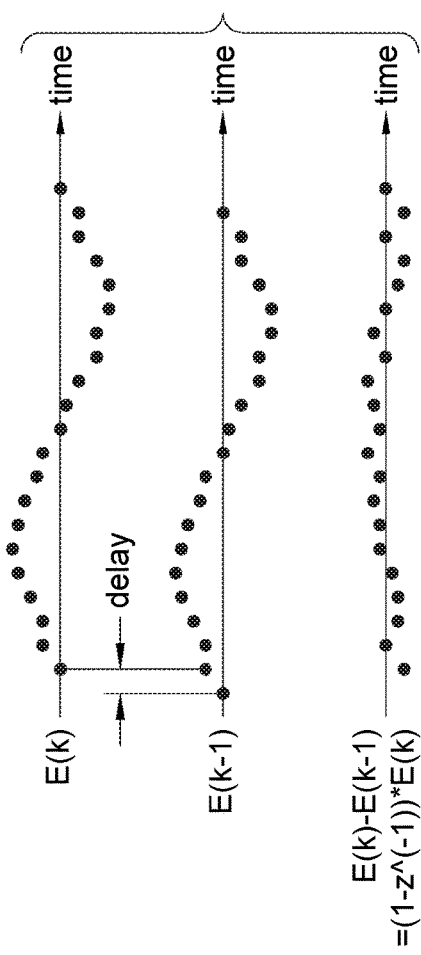
FIG. 5 illustrates error shaping according to an embodiment of the invention.

According to an embodiment of the invention, temporal filtering may be utilized to shaping mismatch error, such that the shaped mismatch error may distribute away from bands of desired signal. Please refer to FIG. 5 illustrating mismatch error shaping according to an embodiment of the invention. As shown in FIG. 5, mismatch error of converting a sequence of values may form an error sequence E(k) with k denoting time index, and the sequence E(k) may be slowly varying at frequencies near bands of desired signal, and hence contaminate desired signal (not shown). However, by subtracting a delayed sequence E(k−1) from the sequence E(k), the resultant sequence E(k)−E(k−1) may be fast varying at frequencies away from bands of desired signal. Thus, the mismatch error is shaped to high-pass band. In terms of z-transform, the delayed sequence may also be expressed as $z^{(-1)}*E(k)$. Accordingly, the sequence E(k)−E(k−1) may be expressed as $(1-z^{(-1)})*E(k)$, meaning the error E(k) is filtered by a first-order high-pass filter $(1-z^{(-1)})$.

Figure 6A:
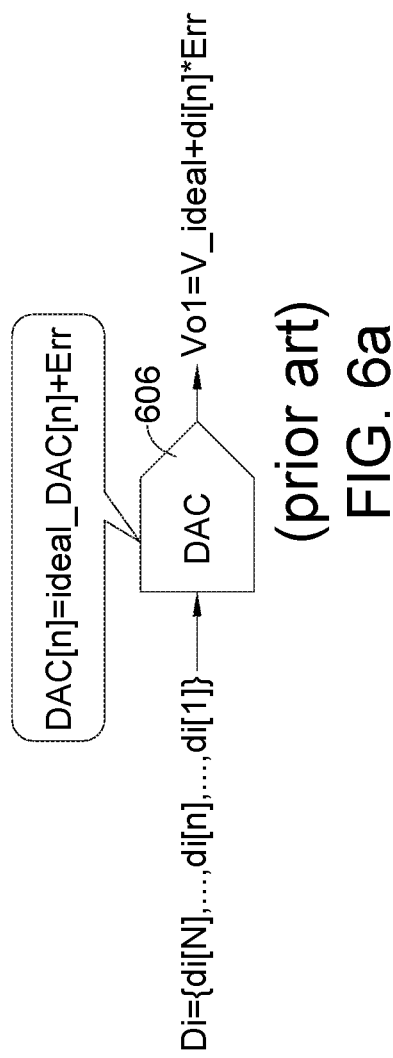
FIG. 6a (prior art) illustrates a DAC with mismatch error.
Figure 6B:
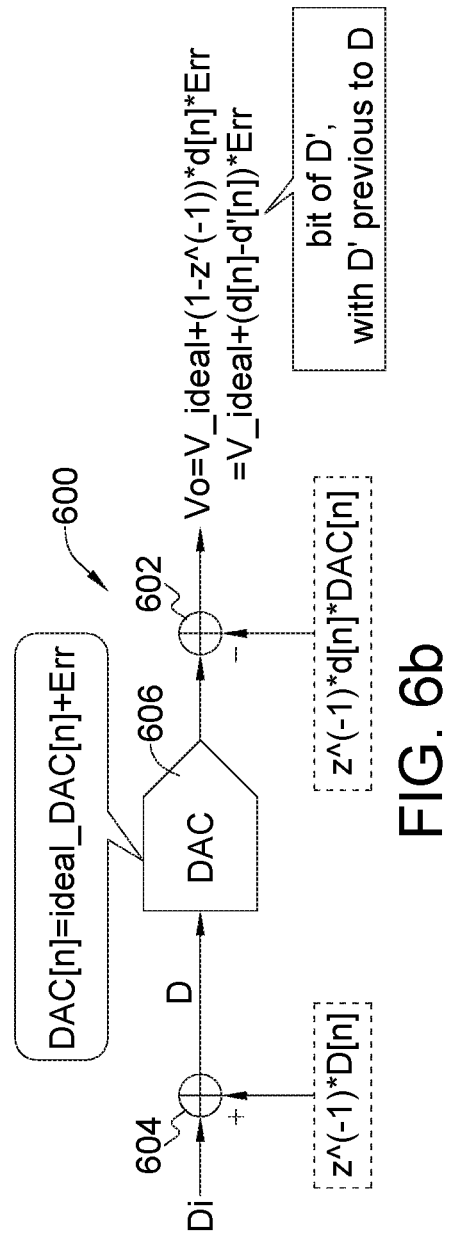

Please refer to FIGS. 6a and 6b. FIG. 6a illustrates a DAC 606 with mismatch error, and FIG. 6b illustrates a system 600 implemented according to the invention for shaping mismatch error of the DAC 606. In FIG. 6a, the DAC 606 converts a digital value Di={di[N], . . . , di[0]} to an analog value Vo1, wherein the analog value Vo1 may be expressed as di[N]*DAC[N]+ . . . +di[n]*DAC[n]+ . . . +di[0]*DAC[0], with DAC[n] being a portion of the analog value Vo generated by the DAC 606 for a bit di[n] of the digital value Di. Assuming that a conversion element (not shown) of the DAC 606 responsible for converting the bit D[n] deviates from its ideal value, the analog value DAC[n] will deviate from its ideal value ideal_DAC[n] by an error Err. Consequently, the analog value Vo1 will shift away from its ideal value ideal_DAC[n] by an error di[n]*Err.

By implementing a first injection circuit 602 (modeled as a sum block) and a second injection circuit 604 to form the DAC system 600 with the DAC 606, mismatch issue may be addressed according to the invention, as shown in FIG. 6b. The injection circuits 602 and 604 are coupled to the DAC 606. With the DAC system 600, a digital value D associated with the digital value Di is converted to an analog value Vo. When the DAC 606 generates the analog value Vo, the first injection circuit 602 enables an analog injection value $-z^{(-1)}*d[n]*DAC[n]$ to be injected to the analog value Vo. The analog injection value $z^{(-1)}*d[n]*DAC[n]$ is a product of the analog value DAC[n] and a bit d'[n] of a previous digital value D'={d'[N], . . . , d'[0]}. In other words, the analog injection value $z^{(-1)}*d[n]*DAC[n]=d'[n]*DAC[n]$ is converted from a digital value D'[n] of the digital value D' by the DAC 606, wherein the digital value D'[n] is contributed by the bit d'[n] of the digital value D'. For example, while the digital value D' equals d'[N]*2^N+ . . . +d'[n]*2^n+ . . . +d'[0]*2^0, the digital value D'[n] may equal d'[n]*2^n.

Symmetric to injecting in analog domain by the first injection circuit 602, as described in FIG. 4, the second injection circuit 604 injects the digital value z^(−1)*D[n] as a digital injection value in digital domain, e.g., sums the digital values Di and z^(−1)*D[n] to form the digital value D.

By cooperation of the injection circuits 602, 604 and the DAC 606, the analog value Vo will deviate from its ideal value V_ideal by an error (1−z^(−1))*d[n]*Err, i.e., (d[n]−d'[n])*Err. Comparing to the original error d[n]*Err induced by the DAC 606 without MES (FIG. 6a), the error (1−z^(−1))*d[n]*Err under MES of the system 600 (FIG. 6b) is shaped to high-pass band, away from bands of desired signal, as explained in FIG. 5.

Please refer to FIG. 7a illustrating a system 700a according to an embodiment of the invention. The system 700a may implement a sub-ranging ADC system receiving an analog value Vi and outputting a digital value Do converted from the analog value Vi. The system 700a includes a first ADC 710 as a coarse ADC, a second ADC 720 as a fine ADC, two sum blocks 730 and 740, and a DAC 706. The ADC 710 converts the analog value Vi to a digital value Di with coarse quantization steps (or resolution). The DAC 706 is coupled between the ADC 710 and the sum block 730, for converting a digital value D to an analog value Vo. The sum block 730 is coupled between the DAC 706 and the ADC 720, for subtracting the analog value Vo from the analog value Vi to form an analog value Vfn. The ADC 720 is coupled between the sum blocks 730 and 740, for converting the analog value Vfn to a digital value Dfn with finer quantization steps (comparing to those of the ADC 710). The sum block 740 is coupled to the ADC 720 and the ADC 710, for combining the digital values Di and Dfn to form the digital value Do.

Similar to FIG. 6, while the DAC 706 may introduce mismatch error for each bit d[n] of the digital value D, the system 700a further includes a first injection circuit 702 (modeled as a sum block) and a second injection circuit 704 (modeled as another sum block) for MES. When the DAC 706 generates the analog value Vo in response to the digital value D, the first injection circuit 702 enables an analog injection value −z^(−1)*d[n]*DAC[n]=d'[n]*DAC[n] to be injected to the analog value Vo. The analog injection value z^(−1)*d[n]*DAC[n] is converted from a digital injection value z^(−1)*D[n]=D'[n] by the DAC 706, wherein d'[n] is a bit of a previous digital value D'={d'[N], . . . , d'[0]} converted by the DAC 706, and the digital injection value D'[n] is a portion of the digital value D' contributed by the digital d'[n]. For example, with the digital value D' equal to d'[N]*2^N+ . . . +d'[n]*2^n+ . . . +d'[0]*2^0, the digital injection value D'[n] may equal d'[n] The second injection circuit 704 is coupled between the ADC 710 and the DAC 706, for combining the digital injection value z^(−1)*D[n] with the digital value Di to form the digital value D. As explained by FIG. 6, by cooperation of the injection circuits 702 and 704, mismatch error embedded in the final digital value Do will be shaped away from bands of desired signal. For example, assuming the mismatch error for the DAC 706 to convert the bit d[n] of the digital value D causes the digital Do to deviate from its ideal value Do_ideal by an error d[n]*err[n] without cooperation of the injection circuits 702 and 704, then the error d[n]*err[n] will be shaped to (1−z^(−1))*d[n]*err[n] with cooperation of the injection circuits 702 and 704.

Please refer to FIG. 7b illustrating a system 700b according to an embodiment of the invention. The system 700b receives an analog value Vi and output a digital value Do converted from the analog value Vi. Similar to the systems 700a shown in FIG. 7a, the system 700b also includes a first ADC 710, a second ADC 720, a sum block 730, a DAC 706 and a first injection circuit 702; however, the second injection circuit 704 and the sum block 740 in the system 700a of FIG. 7a are collectively implemented by a sum block 740b in the system 700b of FIG. 7b. By the sum block 740b, the digital injection value z^(−1)*D[n] is combined with (subtracted from) the sum of the digital values D and Dfn to form the final digital value Do. Thus, the system 700b also implements MES functionality. In other words, the digital injection value z^(−1)*D[n] may be injected to input of the DAC 706 as shown in FIG. 7a, or be combined to a digital signal (e.g., the digital value Dfn) obtained according to the output analog value Vo of the DAC 706, as shown in FIG. 7b.

In the system 700a, the digital injection value z^(−1)*D[n] is injected by the injection circuit 704 with a plus sign, but the resultant analog value Vo is combined with the analog value Vi by the sum block 730 with a minus sign to form the digital value Dfn; therefore, in the system 700b, the same digital injection value z^(−1)*D[n] is injected by the sum block 740b with a minus sign.

Please refer to FIG. 8 illustrating a system 800 according to an embodiment of the invention. The system 800 may be an ADC system receiving an analog value Vi and outputting a digital value Do converted from the analog value Vi. The system 800 includes a sum block 804 and an ADC block 810, which includes a first processing block TF1, a DAC 806, a second processing block TF2 and a sum block 802. The processing block TF1 processes the analog value Vi and generates an analog value Vtf1; for example, the processing block TF1 may include filter(s), amplifier(s) and/or sum block(s), etc. (not shown). The sum block 802 is coupled between the processing blocks TF1 and TF2. The DAC 806 is coupled to the sum block 802 for converting an internal digital value D={d[N], . . . , d[n], . . . d[0]} to an analog value Vo, while the sum block 802 not only combines the analog values Vtf1 and Vo, but also functions as a first injection circuit for enabling an analog injection value z^(−1)*d[n]*DAC[n] to be injected to the analog value Vo. The digital value D is generated by the ADC block 810 in response to the analog value Vi, the analog injection value z^(−1)*d[n]*DAC[n] is converted from a digital injection value z^(−1)*D[n]=D'[n] by the DAC 806, and the digital injection value D'[n] is a portion of a previous digital value D'={d'[N], . . . , d'[n], . . . , d'[0]} contributed by the bit d'[n].

The ADC block 810 also generates a value Sx according to the analog value Vo. The processing block TF2 processes the value Sx to form a resultant value Sx2, and the ADC block 810 generates a digital value Dtf2 according to the value Sx2; for example, the processing block TF2 may include digital filter(s), amplifier(s) and/or sum block(s), etc. (not shown). The sum block 804 is coupled to the ADC 810, and functions as a second injection circuit for combining the digital value Dtf2 and a digital injection value z^(−1)*D[n]TF2 to form the digital value Do. The digital injection value z^(−1)*D[n]TF2 is a result of processing the digital injection value z*(−1)*D[n] by the processing block TF2 (or by other processing block, not shown, which has same transfer function as the processing block TF2). Injections of the analog injection value z^(−1)*d[n]*DAC[n] and the digital injection value z^(−1)*D[n]TF2 implement MES for the DAC 806, so as to shape mismatch error caused by converting the bit d[n]. For example, assuming the digital value Do deviates from its ideal value Do_ideal by an error d[n]*err[n] TF2 without MES, then the digital value Do will deviate from the ideal value Do_ideal by an high-pass shaped error $(1-z^\wedge(-1))$*d[n]*err[n]TF2 instead. The digital injection value can also approximate $z^\wedge(-1)$*D[n]TF2 only in the band-of-interest (e.g., bands of desired signal).

Figure 9:
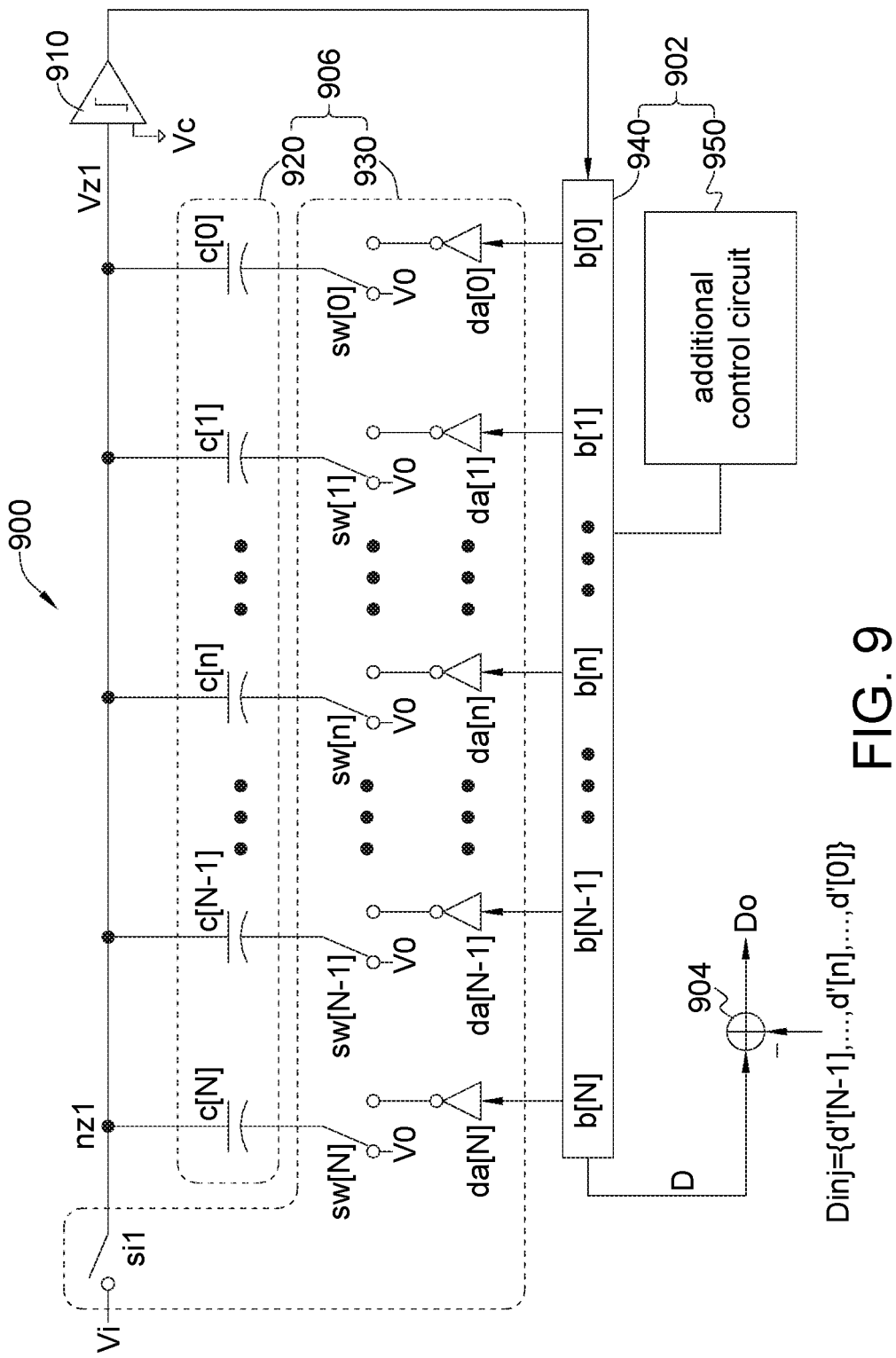
FIG. 9 illustrates a system according to an embodiment of the invention.

Please refer to FIG. 9 illustrating a system 900 according to an embodiment of the invention; the system 900 may implement a SAR ADC for converting an analog value Vi to a digital value Do with MES. The system 900 includes a comparator 910, a register 940, a peripheral circuit 930, an additional control circuit 950 and a capacitor array 920 which includes capacitors c[N], c[N−1], . . . , c[1] and c[0]. The peripheral circuit 930 may include a switch si1, a plurality of switches sw[N], sw[N−1], . . . , sw[1] and sw[0], and a plurality of bias circuits da[N], da[N−1], . . . , da[1] and da[0]. The switch si1 is coupled between the analog value Vi and a common node nz1. The comparator 910 is coupled to the node nz1, and capable of comparing if a voltage Vz1 at the node nz1 is greater than a voltage Vc. Each capacitor c[n] (for n=N, N−1, . . . to 0) may have a top terminal coupled to the node nz1, and a bottom terminal coupled to the switch sw[n] to be selectively conducted to a constant reset voltage V0 (e.g., a ground level) or the bias circuit da[n]. The register 940 may register bits b[N], b[N−1], . . . , b[1] and b[0]. Each bias circuit da[n] may provide voltage −b[n]*Vr according to the bit b[n]. The system 900 in FIG. 9 is single-ended example, but can be extended to differential designs.

Figure 10:
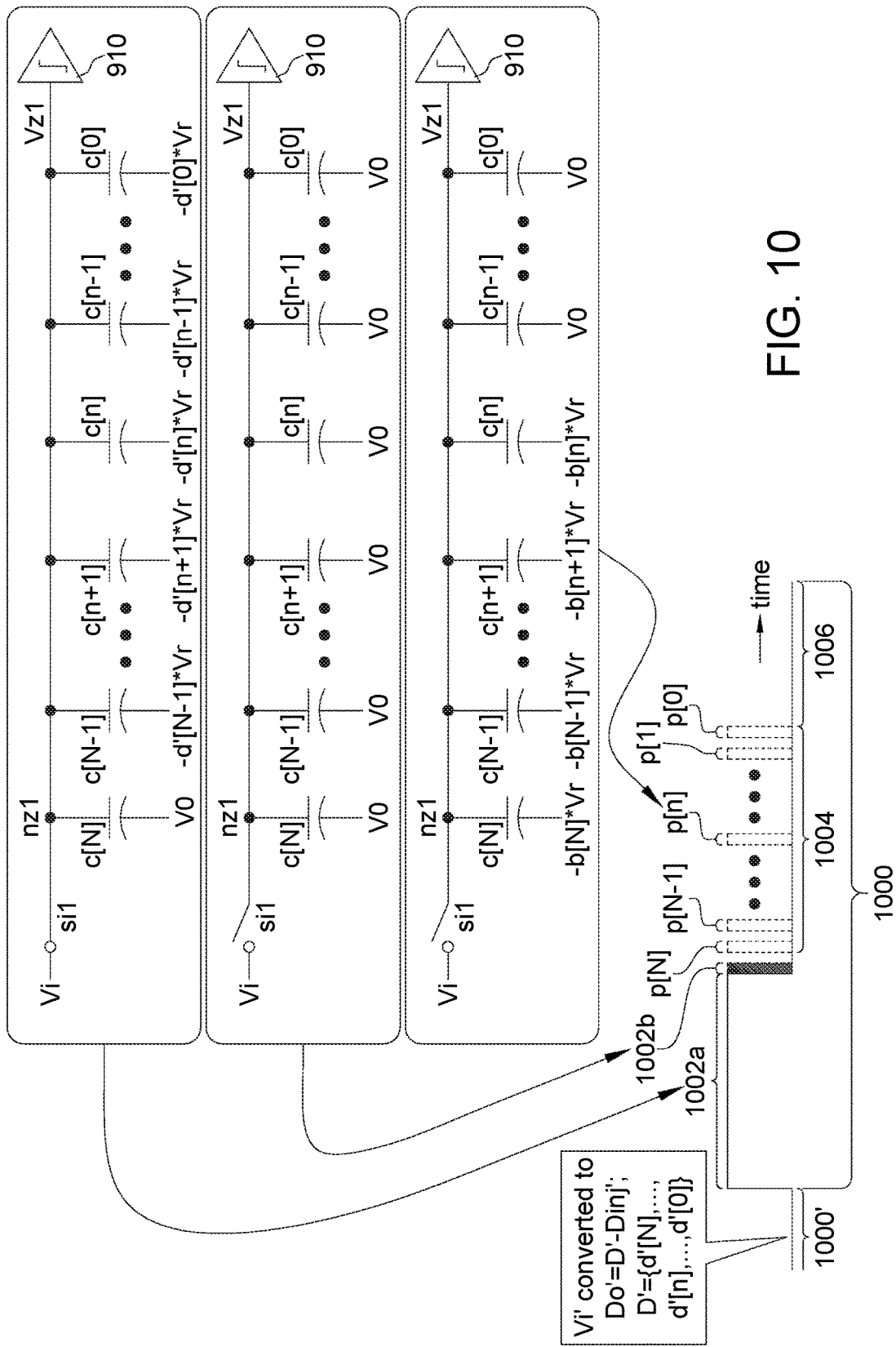
FIG. 10 illustrates operations of the system shown in FIG. 9.

Along with FIG. 9, please refer to FIG. 10 illustrating operations of the system 900. The system 900 spends a cycle 1000 to convert the analog value Vi to the digital value Do, as shown in FIG. 10. Before the cycle 1000, during a previous cycle 1000', the system 900 has converted a previous analog value Vi' to a previous digital value Do'=D'−Dinj', with digital values D and Dinj respectively being previous versions of two digital values D and Dinj, and D'={d'[N], . . . , d'[n], . . . , d'[0]}.

The cycle 1000 includes a sample-and-inject phase 1002a, a reset phase 1002b, a conversion phase 1004 and a (optional) spare phase 1006. During the sample-and-injection phase 1002a, the switch si1 conducts the analog value Vi to the node nz1, and the additional control circuit 950 controls the register 940 to keep registering the bits d'[N] to d'[0] as the bits b[N] to b[0], controls a first subset (e.g., sw[N]) of the switches sw[N] to sw[0] to conduct the voltage V0 to the bottom terminals of a first subset (e.g., c[N]) of the capacitors c[N] to c[0], and controls a second subset (e.g., sw[N−1] to sw[0]) of the switches sw[N] to sw[0] to respectively conduct a corresponding second subset (e.g., da[N−1] to da[0]) of the bias circuits da[N] to da[0] to the bottom terminals of a corresponding second subset (e.g., c[N−1] to c[0]) of the capacitors c[N] to c[1], such that each bias circuit da[n] belonging to the second subset of the bias circuits provides a voltage −d'[n]*Vr to the bottom terminal of the capacitor c[n].

After the sample-and-injection phase 1002a, the switch si1 stops conducting the analog value Vi to the node nz1, the additional control circuit 950 controls the peripheral circuit 930 to conduct the bottom terminals of the capacitors c[N] to c[0] to the voltage V0 during the reset phase 1002b, and the bits b[N] to b[0] of the register 940 are reset to be undetermined. Thus, an analog injection value Vinj (not shown) reflecting a sum d[N−1]*c[N−1]*+d[N−2]*c[N−2]+ . . . +d[1]*c[1]+ . . . +d[0]*c[0] is combined with the analog value Vi to form a combined analog value Vcb (not shown), and the combined analog value Vcb will be converted to digital value at the comparison phase 1004. In other words, as the capacitor array 920 and the peripheral circuit 930 will jointly function as a DAC 906 during the comparison phase 1004 by reflecting the digital bits b[N] to b[0] to the analog voltage Vz1, the additional control circuit 950 and the register 940 have jointly operated as a first injection circuit 902 for enabling the analog injection value Vinj to be injected to the voltage Vz1 during the sample-and-injection phase 1002a and the reset phase 1002b. The analog injection value Vinj is converted from the digital injection value Dinj by the DAC 906, wherein the digital injection value Dinj is formed by the second subset (e.g., d'[N−1] to d'[0]) of bits of the previous digital value D', e.g., Dinj={d'[N−1], . . . , d'[0]}.

During the comparison phase 1004, the switch si1 stops conducting the analog value Vi to the node nz1. The comparison phase 1004 includes a plurality of bit-decision periods p[N], p[N−1], . . . , p[1] and p[0]. After phase 1002a and before the period pr[N], the comparator 910 compares whether the voltage Vz is greater than the voltage Vc to determine whether the bit b[N] is 1 or the opposite. During the period p[N], the switch sw[N] switches to the bias circuit da[N] which provides a setting voltage −b[N]*Vr, while the rest switches sw[N−1] to sw[0] remain conducting to the voltage V0, such that the voltage Vz1 at the node nz1 reflects a value Vcb−b[N]*Vr*c[N]/ct, with ct reflecting a total capacitance of the capacitors c[N] to c[0]. The comparator 910 compares whether the voltage Vz1 is greater than the voltage Vc to determine whether the bit b[N−1] is 1 or the opposite.

Once the bit b[N−1] is determined, the system 900 proceeds to the period p[N−1]. During the period p[N−1], the switch sw[N−1] switch to the bias circuits da[N−1] which provides a voltages −b[N−1]*Vr, while the rest switches sw[N−2] to sw[0] remain conducting to the voltage V0, so the voltage Vz1 reflects a value Vcb−Vr*(b[N]*c[N]+b[N−1]c[N−1])/ct. The comparator 910 compares whether the voltage Vz1 is greater than the voltage Vc to determine whether the bit b[N−2] is 1.

As the bits b[N−1], . . . to b[n] are successively determined respectively after the periods pr[N], pr[N−1], . . . to pr[n+1], at the period p[n], the switches sw[N] to sw[n] respectively switch to the bias circuits da[N] to da[n] which respectively provide voltages −b[N]*Vr to −b[n+1]*Vr and −b[n]*Vr, while the rest switches sw[n−1] to sw[0] remain conducting to the voltage V0, so the voltage Vz1 reflects a value Vcb−Vr*(b[N]*c[N]+b[N−1]*c[N−1]+ . . . +b[n+1]*c[n+1]+b[n]*c[n])/ct. The comparator 910 compares whether the voltage Vz1 is greater than the voltage Vc to determine whether the bit b[n−1] is 1. After the periods pr[N] to pr[0], all the bits b[N] to b[0] are determined to form the digital value D={b[N], . . . , b[n], . . . , b[0]}.

Practical capacitances of the capacitors c[N] to c[0] deviate from ideal capacitances. However, the register 940 and the additional control circuit 950 collectively operate as a first injection 902 enabling the analog injection value Vinj to be injected to the analog value Vcb during the phases 1002a and 1002b. Symmetrically in digital domain, the system 900 may, for example, further include a second injection circuit 904 (modeled as a sum block) for combining the digital value D with the digital injection value Dinj to form the digital value Do. Therefore, mismatch of the capacitor array 920 is shaped away from bands of desired signal.

According to the invention, absolute capacitance deviation of each individual capacitor c[n] is less essential than deviation of the relative capacitance ratio of the capacitors c[N] to c[0], because MES according to invention performs shaping symmetrically in both digital and analog domain. For example, assuming that the capacitor array includes capacitor c[3] to c[0] with ideal capacitance ratio 8:4:2:1 but actual capacitances 7.6, 4.3, 1.8 and 0.9 units. According to the invention, capacitance deviation of each capacitor is shaped by injecting corresponding deviations in both analog and digital domains, and the injections may be arranged to eliminate deviation defined by a selected capacitor, e.g., c[3], with deviations of the rest capacitors left to be shaped. Hence, the selected capacitor c[3] may be considered to have a standard capacitance of 1 unit while the rest capacitors c[2] to c[0] are considered to have relative capacitances 4.3/7.6, 1.8/7.6 and 0.9/7.6 units. Accordingly, in the embodiment of FIG. 9 and FIG. 10, the digital value Dinj injected in digital domain is formed by the second subset of bits (e.g., d'[N−1] to d'[0]) of the previous digital value D', not by all the bits d'[N] to d'[0]. For example, the digital value Dinj may equal $d'[N-1]*2^{(N-1)}+ \ldots +d'[0]*2^0$, while the digital value D' equals $d'[N]*2^N+d'[N-1]*2^{(N-1)}+ \ldots +d'[0]*2^0$.

Figure 11:
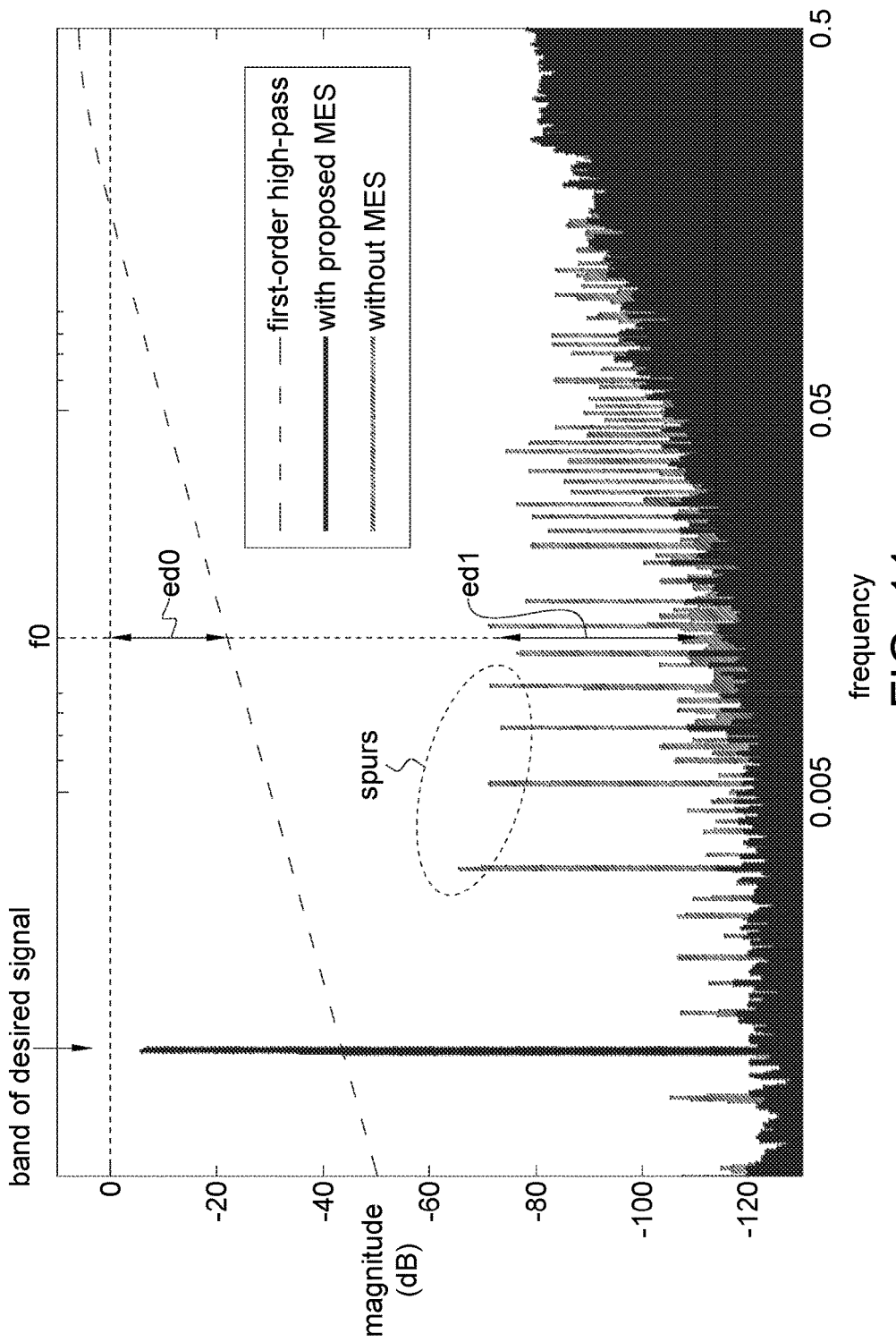
FIG. 11 illustrates performance of the system shown in FIG. 9.

Along with FIG. 9 and FIG. 10, please refer to FIG. 11 which compares performances of the prior art system 200 (FIG. 2) and the system 900 (FIG. 9) of the invention. FIG. 11 illustrates a spectrum of a sequence of the digital value Do output by the system 200 (labeled as "without MES"), a spectrum of the digital value D output by the system 900 (labeled as "with proposed MES"), and a frequency domain response of a first-order high-pass filter. As shown in FIG. 11, the spectrum without MES suffers obvious spurs near band of desired signal; on the contrary, the spectrum with proposed MES successfully suppresses spurs near band of desired signal. The spectrum with proposed MES also shows improvement greater than expected improvement of first-order high-pass filtering. For example, at a frequency f0, the response of the first-order high-pass filtering shows an improvement ed0 comparing to a flat response (without any filtering). At the frequency f0, the spectrum with proposed MES shows an improvement ed1 comparing to the spectrum without MES, and the improvement ed1 is greater than the improvement ed0 expected by first-order high-pass filtering. While converting the analog value Vi to the digital value D, because the first injection circuit 902 (FIG. 9) injects the analog injection value Vinj by sequentially loading the digital injection value Dinj (during the phases 1002a and 1002b, FIG. 10) and the digital value D (during the periods p[N] to p[0]), input to the DAC 906 is dithered. Thus, mismatch error of the DAC 906 is not only shaped by first-order high-pass filtering, but also be randomized by dithering input to the DAC 906; the system 900 therefore achieves performance better than first-order high-pass filtering.

Figure 12:
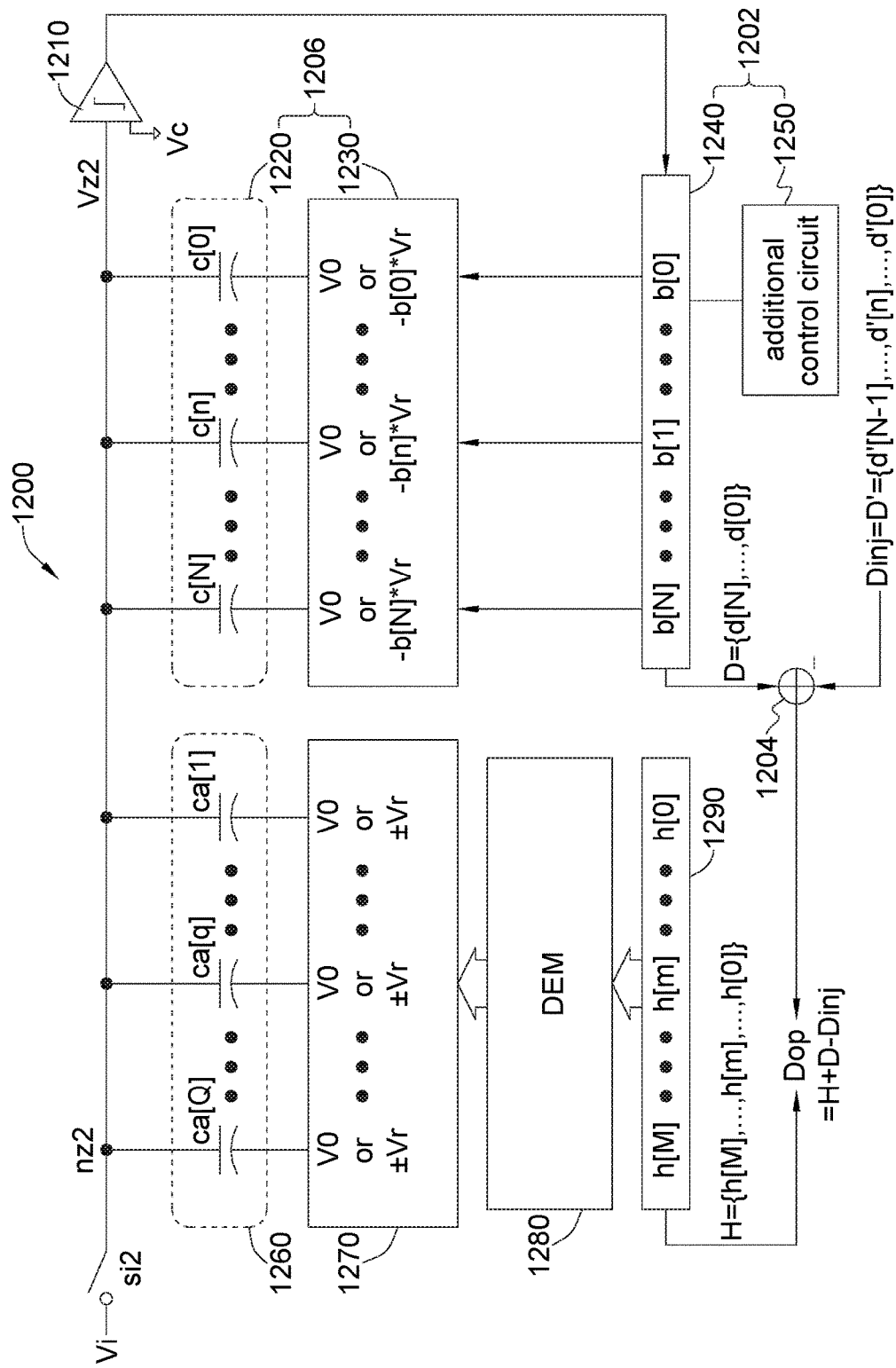
FIG. 12 illustrates a system according to an embodiment of the invention.
Figure 13A:
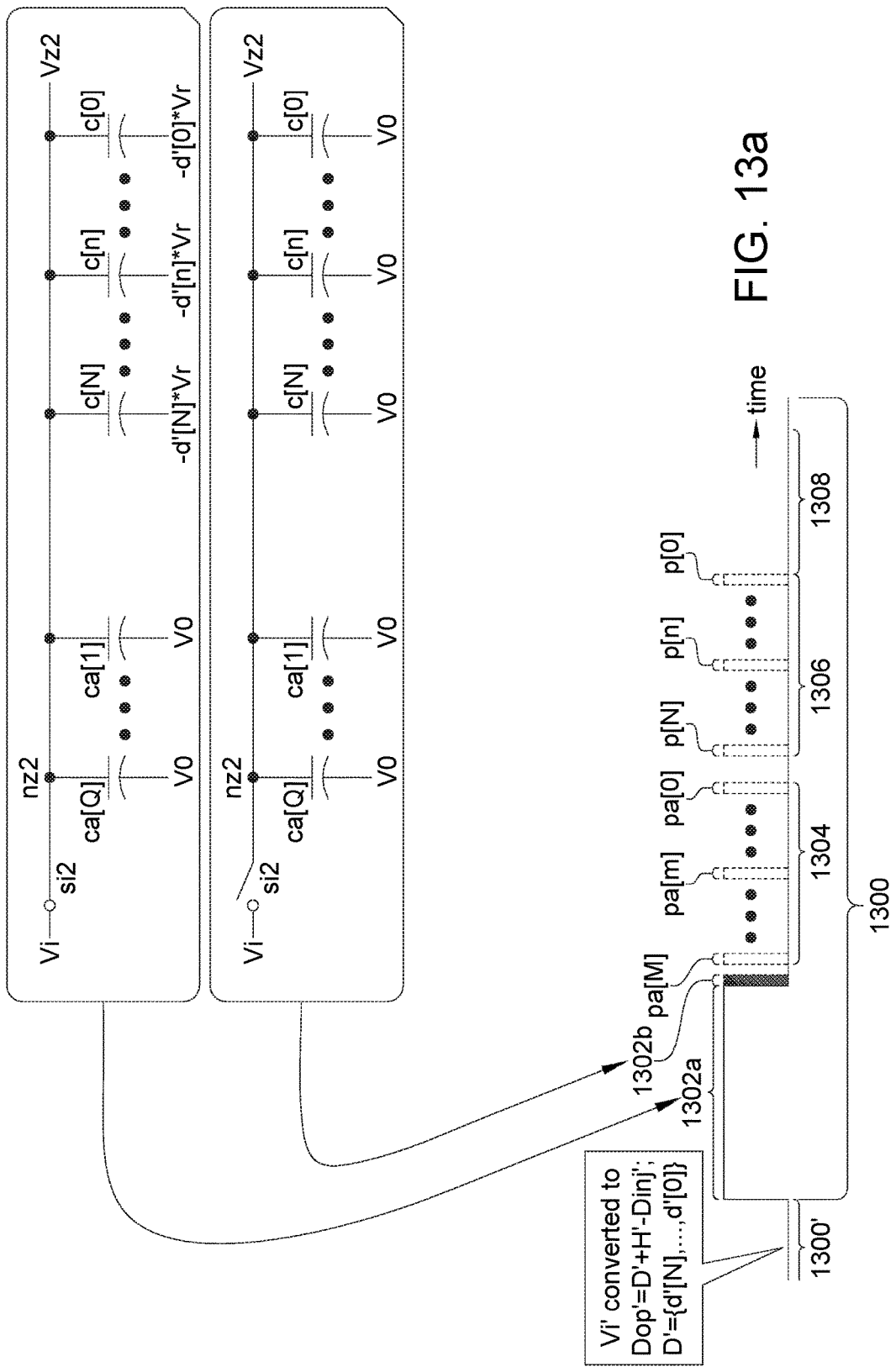
FIGS. 13a and 13b illustrate operations of the system shown in FIG. 12.
Figure 13B:
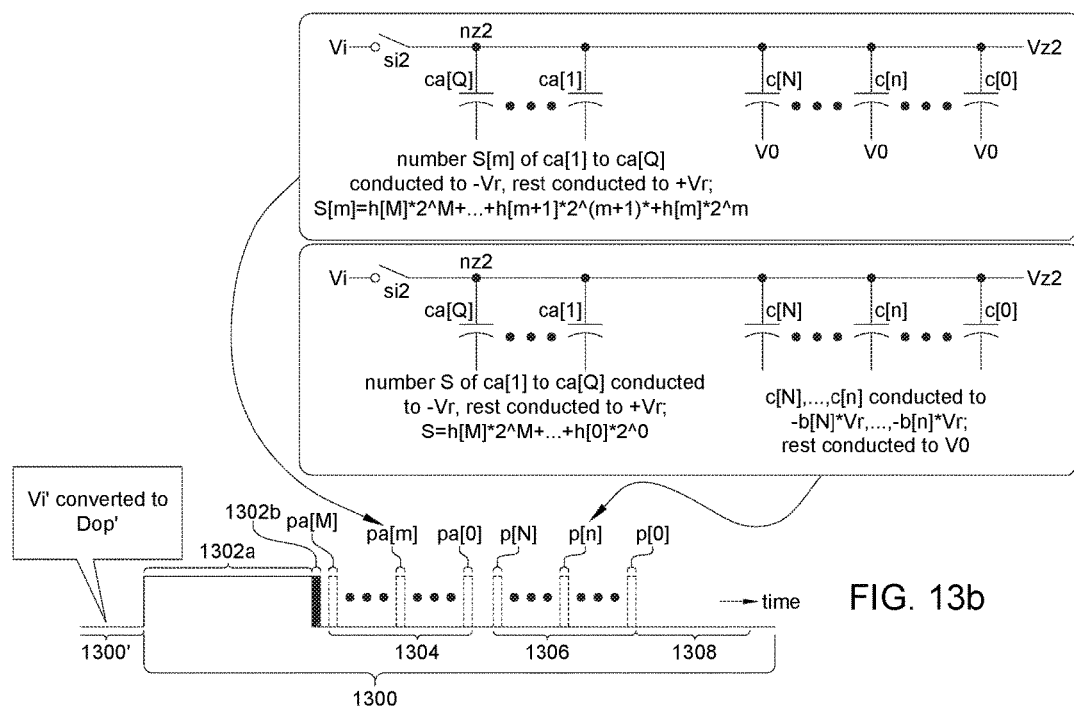

Please refer to FIG. 12, FIG. 13a and FIG. 13b. FIG. 12 illustrates a system 1200 according to an embodiment of the invention, FIG. 13a and FIG. 13b illustrate operations of the system 1200. The system 1200 may implement a SAR ADC for converting an analog value Vi to a digital value Dop, i.e., the digital value Dop is formed by combining two digital values H and D as well as a digital injection value Dinj with a minus sign, wherein the digital value H equals {h[M], ..., h[m], ..., h[0]}, and the digital value D equals {d[N], ..., d[n], ..., d[0]}.

The system 1200 includes a switch si2, a comparator 1210, two registers 1240 and 1290, two peripheral circuits 1230 and 1270, an additional control circuit 1250, a DEM circuit 1280 and two capacitor arrays 1220 and 1260. The switch si2 is coupled between the analog value Vi and a common node nz2. The comparator 1210 is coupled to the node nz2, and capable of comparing if a voltage Vz2 at the node nz2 is greater than a voltage Vc.

The capacitor array 1220 includes capacitors c[N], ..., c[n], ..., c[0]; each capacitor c[n] (for n=N, N−1, ... to 0) has a top terminal coupled to the node nz2, and a bottom terminal coupled to the peripheral circuit 1230. The register 1240 is coupled to the peripheral circuit 1230, and registers bits b[N] to b[0]. The peripheral circuit 1230 selectively conducts the bottom terminal of each capacitors c[n] to a reset voltage V0 or a voltage −b[n]*Vr according to the bit b[n] of the register 1240. The additional control circuit 1250 is coupled to the register 1240 and the peripheral circuit 1230.

The capacitor array 1260 includes a number Q of capacitors ca[Q], ..., ca[q], ..., ca[1]; each capacitor ca[q] (for q=Q to 1) has a top terminal coupled to the node nz2, and a bottom terminal coupled to the peripheral circuit 1270. The number Q equals $2^{(M+1)}-1$. The DEM circuit 1280 is coupled between the peripheral circuit 1270 and the register 1290. The register 1290 registers bits h[M] to h[0] to form the digital value H. The DEM circuit 1280 selects a number (one, some or all) of the capacitors ca[Q] to ca[1] by pseudo-random shuffling with the number reflecting the bits h[M] to h[0], and the peripheral circuit 1270 conducts the bottom terminals of the selected capacitors to a voltage −Vr, and conducts the rest of the capacitors ca[Q] to ca[1] to a voltage +Vr.

Ideally, all the capacitors ca[Q] to ca[1] in the capacitor array 1260 are of the same capacitances, and the capacitances of the capacitors ca[Q], ..., ca[q], ..., ca[1] and c[N], ..., c[n], ..., c[0] are $2^{(N+1)}: \ldots :2^{(N+1)}: \ldots :2^{(N+1)}:2^N: \ldots :2^n: \ldots :2^0$.

As shown in FIG. 13a and FIG. 13b, the system 1200 spends a cycle 1300 to convert the analog value Vi to the digital value Dop. Before the cycle 1300, by a previous cycle 1300', the system 1200 has converted a previous analog value Vi' to a previous digital value Dop'=H'+D'−Dinj', with H', D' and Dinj' being previous versions of the digital values H, D and Dinj, and D' equal to {d'[N], ..., d'[0]}

The cycle 1300 includes a sample-and-inject phase 1302a, a reset phase 1302b, an MSB conversion phase 1304, an LSB conversion phase 1306, and a (optional) spare phase 1308. During the sample-and-injection phase 1302a (FIG. 13a), the switch si2 conducts the analog value Vi to the node nz2, and the additional control circuit 1250 controls the register 1240 to keep registering the bits d'[N] to d'[0] as the bits b[N] to b[0], and controls the peripheral circuit 1230 for conducting the bottom terminals of the capacitors c[N] to c[0] respectively to the voltages −d'[N]*Vr to −d'[0]*Vr. During the sample-and-injection phase 1302a, the peripheral circuit 1270 keeps conducting the bottom terminals of the capacitors ca[Q] to ca[1] to the voltage V0, and the bits h[M] to h[0] of the register 1290 are reset to be undetermined.

After the sample-and-injection phase 1302a, the switch si2 stops conducting the analog value Vi to the node nz2. During the reset phase 1302b, the additional control circuit 1250 controls the peripheral circuit 1230 for conducting the bottom terminals of the capacitors c[N] to c[0] to the voltage V0, and the bits b[N] to b[0] of the register 1240 are reset to be undetermined. Thus, an analog injection value Vinj (not shown) reflecting a sum $d'[N]*c[N]*+ \ldots +d'[0]*c[0]$ is combined with the analog value Vi to form a combined analog value Vcb (not shown) at the sample-and-inject phase 1302a and the reset phase 1302b, and the combined analog value Vcb will be converted to digital value at the MSB and LSB comparison phases 1304 and 1306. As the capacitor array 1220 and the peripheral circuit 1230 will collectively operate as a DAC 1206 during the LSB comparison phase 1004 by reflecting the digital bits b[N] to b[0] to the analog voltage Vz2, the register 1240 and the additional control circuit 1250 have collectively operated as a first injection circuit 1202 for enabling the analog injection value Vinj to be injected to the voltage Vz2 during the sample-and-inject phase 1302a and the reset phase 1302b, with the analog injection value Vinj converted from a digital injection value Dinj=D' by the DAC 1206.

After the sample-and-inject phase 1302a and the reset phase 1302b, the MSB comparison phase 1304 starts, which includes a plurality of bit-decision periods pa[M], ..., pa[m], ..., pa[0]. After the phase 1302b and before the period pa[M], the comparator 1210 compares whether the voltage Vz2 is greater than the voltage Vc to determine whether the bit h[M] is 1 or the opposite. During the period pa[M], the DEM circuit 1280 selects a number h[M]*2^M of capacitors from the capacitors ca[Q] to ca[1] of the capacitor array 1260, the peripheral circuit 1270 conducts the bottom terminals of the selected h[M]*2^M capacitors to the voltage −Vr and keeps conducting the bottom terminals of the rest unselected capacitors to the voltage +Vr, and the comparator 1210 compares whether the voltage Vz2 is greater than the voltage Vc to determine whether the bit h[M−1] is 1 or the opposite. On the other hand, the peripheral circuit 1230 keeps the bottom terminals of the capacitors c[N] to c[0] conducted to the voltage V0 during the MSB comparison phase 1304.

During the period pa[m] (for m=(M−1) to 1, FIG. 13b), the DEM circuit 1280 selects a number S[m] of capacitors from the capacitors ca[Q] to ca[1] of the capacitor array 1260, the peripheral circuit 1270 conducts the bottom terminals of the selected S[m] capacitors to the voltage −Vr and keeps conducting the bottom terminals of the rest unselected (Q−S[m]) capacitors to the voltage +Vr, and the comparator 1210 compares whether the voltage Vz2 is greater than the voltage Vc to determine if the bit h[m−1] equals 1. The number S[m] equals h[M]*2^M+ . . . +h[m+1]*2^(m+1)+h[m]*2^m.

After the MSB comparison phase 1304, the bits h[M] to h[0] are determined to form the most significant M+1 bits of the digital value Dop, and then the system 1200 proceeds to the LSB comparison phase 1306. The comparison phase 1306 includes a plurality of bit-decision periods p[N], ..., p[n], ..., p[0]. After phase 1304 and before the period p[N], the comparator 1210 compares whether the voltage Vz2 is greater than the voltage Vc to determine whether the bit b[N] is 1 or the opposite. During the period p[N], the peripheral circuit 1230 conducts the bottom terminal of the capacitor c[N] to a voltage −b[n]*Vr and keeps conducting the bottom terminals of the capacitors c[N−1] to c[0] to the voltage V0, and the comparator 1210 compares whether the voltage Vz2 is greater than the voltage Vc to determine whether the bit b[N−1] equals 1. On the other hand, after the MSB comparison phase 1304, the peripheral circuit 1270 conducts the bottom terminals of a number S of the capacitors ca[Q] to ca[1] to the voltage −Vr, and the conducts the bottom terminal of the rest number (Q−S) of the capacitors ca[Q] to ca[1] to the voltage +Vr. The number S equals h[M]*2^M+ . . . +h[0]*2^0.

During the period p[n] (n=(N−2) to 1), the peripheral circuit 1230 conducts the bottom terminals of the capacitors c[N] to c[n] respectively to the voltages −b[N]*Vr to −b[n]*Vr, and conducts the bottom terminal of the rest capacitors c[n−1] to c[0] to the voltage V0. The comparator 1210 compares whether the voltage Vz2 is greater than the voltage Vc to determine if the bit d[n−1] equals 1. After the LSB comparison phase 1306, all the bits b[N] to b[0] are determined to form a digital value D={b[N], ..., b[n], ..., b[0]}. The system 1200 may, for example, further include a second injection circuit 1204 (modeled as a sum block) for combining the digital value D and the digital injection value Dinj=D', and the combined result is further combined with the digital value H to form the digital value Dop. Therefore, by cooperation of the injection circuits 1202 and 1204, mismatch of the capacitor array 1220 is shaped away from bands of desired signal. On the other hand, mismatch of the capacitor array 1260 is shaped by operation of the DEM circuit 1280, which shuffles usages of the capacitors ca[Q] to ca[1] for shaping their mismatches.

Figure 14A:
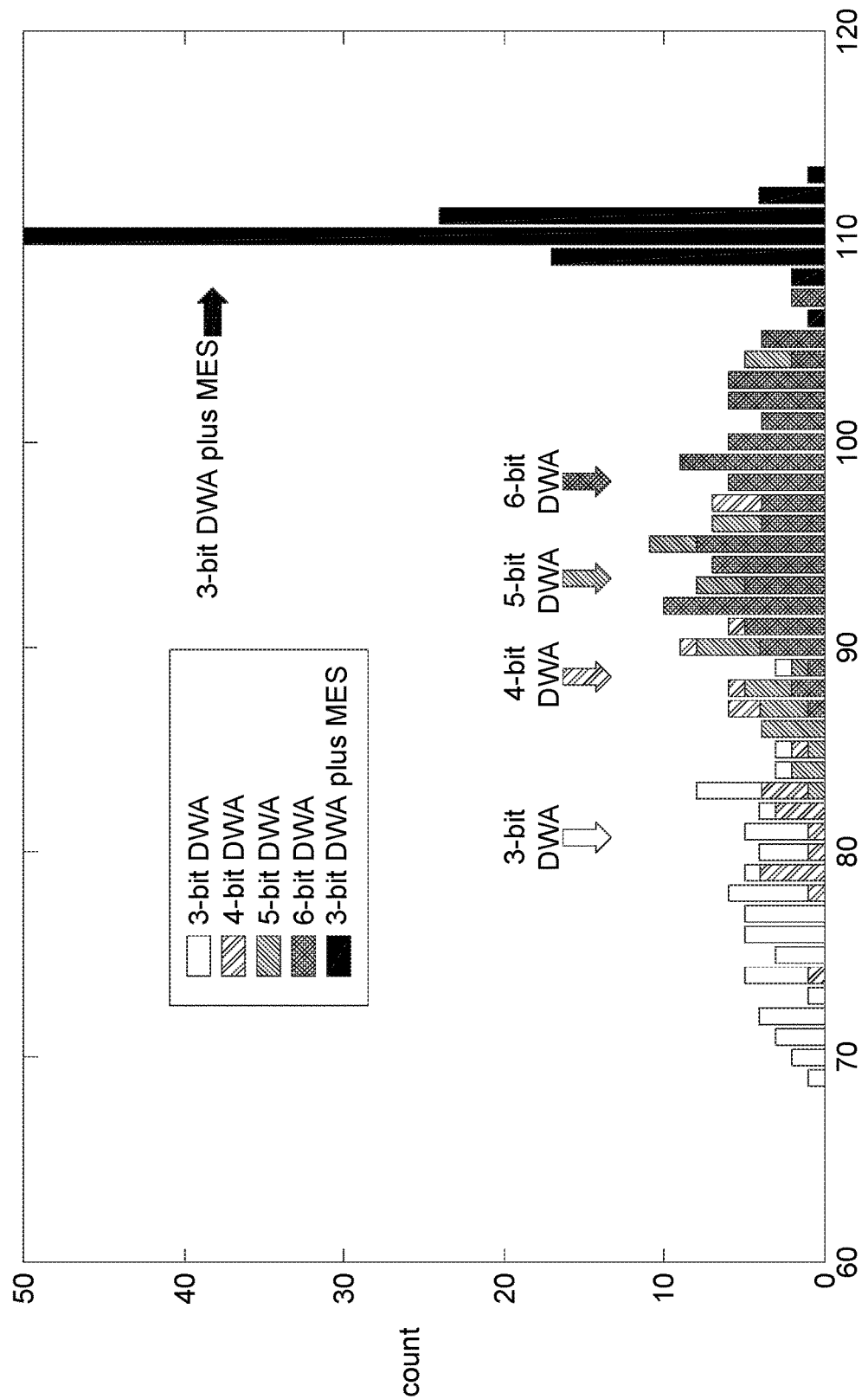
FIGS. 14a and 14b illustrate performances of the system shown in FIG. 12.
Figure 14B:
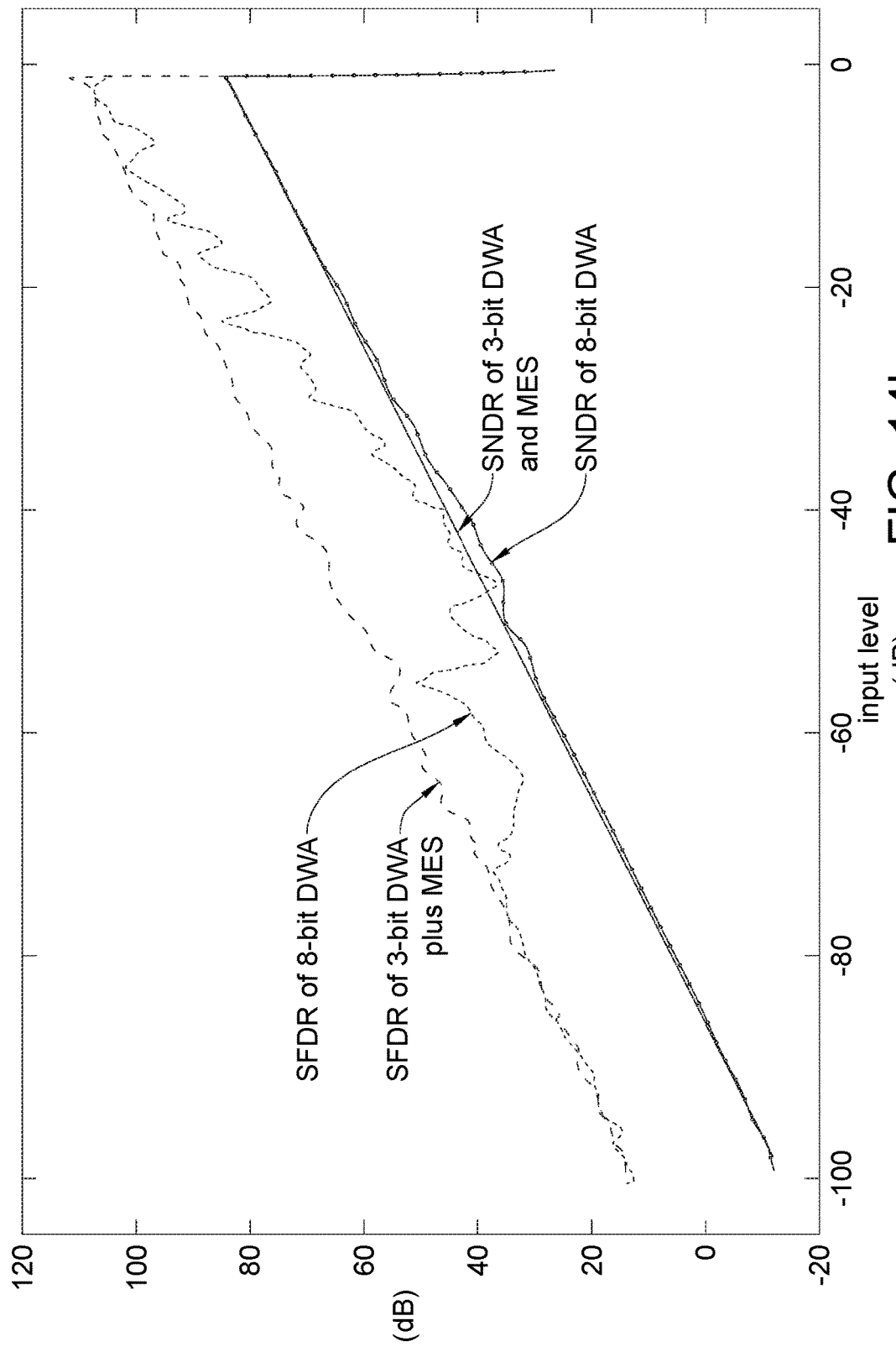

Though DEM is also a technique for shaping mismatch, MES by symmetrically injections in digital and analog domains according to the invention is proved to be superior. Please refer to FIGS. 14a and 14b comparing DEM and MES. FIG. 14a illustrates counts versus SFDR (spur-free dynamic range) achieved by different techniques for converting a digital value of 12 bits, including 3-bit DWA (data weighted average, as one kind of DEM), 4-bit DWA, 5-bit DWA, 6-bit DWA and 3-bit DWA plus MES. The technique of 3-bit DWA applies DWA for shaping mismatch error of the most significant 3 bits, with mismatch error of the rest 9 bits left not handled. Similarly, the technique of 6-bit DWA applies DWA for shaping mismatch error of the most significant 6 bits, with mismatch error of the rest 6 bits left not handled. On the other hand, the technique of 3-bit DWA plus MES applies DWA for the most significant 3 bits, and applies MES for the least significant 9 bits; this technique can be implemented by the system 1200 in FIG. 12, with the numbers M=2, Q=7 and N=8. As shown in FIG. 14a, the technique of 3-bit DWA plus MES provides better SFDR than the rest techniques only adopting DWA, even the technique of 6-bit DWA. Notice that, as bit number of DWA increases linearly, layout area for implementing DWA increases exponentially. For example, layout areas for implementing 3-bit DWA, 4-bit DWA, 5-bit DWA and 6-bit DWA may approximate 1:2:4:8. Larger layout area also causes greater power consumption. On the contrary, layout area and power consumption for implementing MES are relatively lower. Hence, by jointly adopting DWA for a few most significant bits and MES for the rest bits, superior performances can be achieved without compromising power consumption and layout area.

FIG. 14b illustrates SFDR versus input level achieved by two different techniques, including 8-bit DWA and 3-bit DWA plus MES, wherein the technique of 8-bit DWA applies DWA for the most significant 8 bits. FIG. 14b also illustrates SNDR (signal to noise plus distortion ratio) versus input level achieved by the two techniques. As shown in FIG. 14b, the technique adopting 3-bit DWA plus MES achieves better performances than the technique only adopting 8-bit DWA. Note that layout area for 8-bit DWA is approximately 32 times of that for 3-bit DWA. Comparing to the system 900 (FIG. 9) adopting MES only, the system 1200 (FIG. 12) jointly adopting DEM (e.g., DWA) and MES is beneficial regarding dynamic range.

Figure 15:
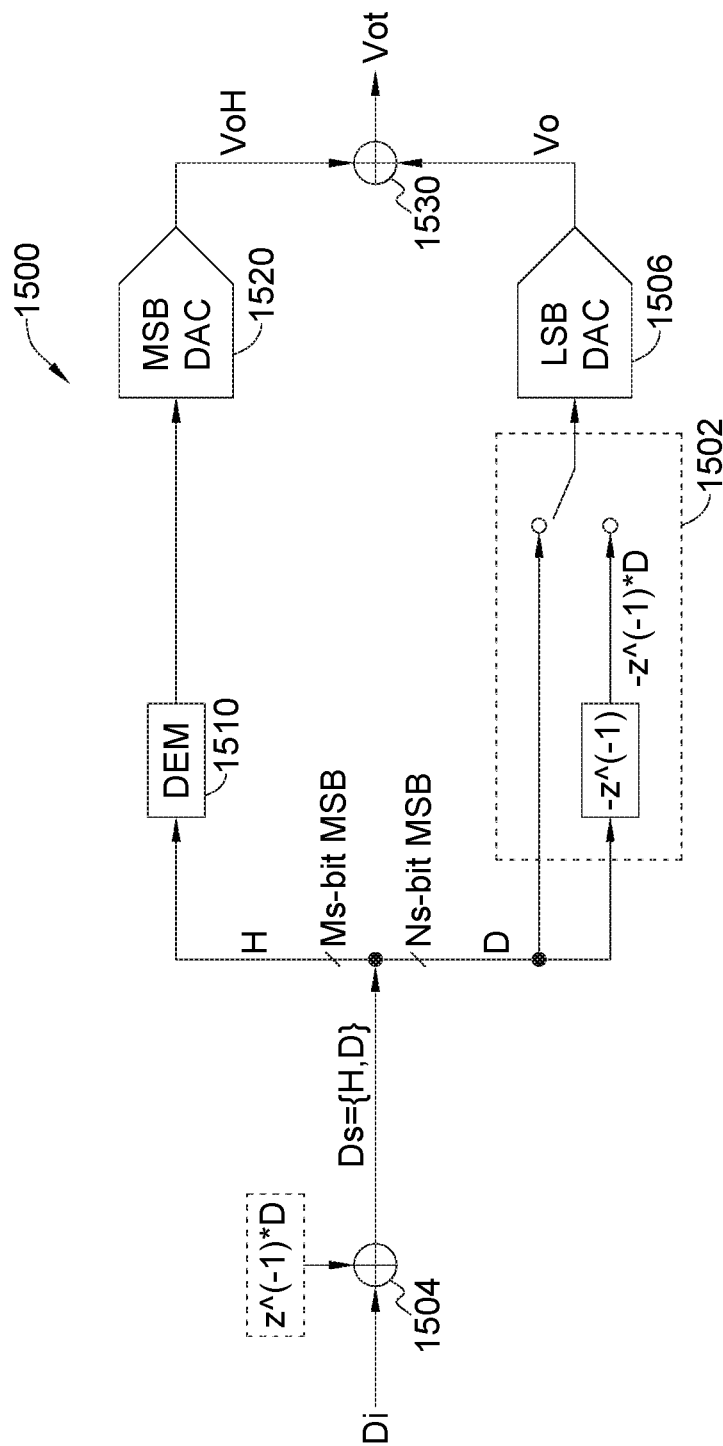
FIG. 15 illustrates a system according to an embodiment of the invention.

Please refer to FIG. 15 illustrating a system 1500 according to an embodiment of the invention. The system 1500 spends a cycle (not shown) to receive a digital value Di and output an analog value Vot converted from the digital value Di. The system 1500 includes a DEM circuit 1510, a first DAC 1520 as an MSB DAC, a sum block 1530, a first injection circuit 1502, a second DAC 1506 as an LSB DAC, and a second injection circuit 1504 modeled as a sum block.

The DEM circuit 1510 is coupled between the second injection circuit 1504 and the DAC 1520. During the cycle, the DEM circuit 1510 receives a digital value H formed by the most significant Ms bits of a digital value Ds, codes the digital value H from binary code to thermometer code, and accordingly controls the DAC 1520 to synthesize an analog value VoH converted from the digital value H.

On the other hand, the first injection circuit 1502 is coupled between the second injection circuit 1504 and the DAC 1506. During the cycle for the digital value Di to be converted, the first injection circuit 1502 sequentially loads a digital injection value $z^{(-1)}*D$ with a minus sign, and loads a digital value D formed by the least significant Ns bits of the digital value Ds to the DAC 1506 respectively during different periods of the cycle, and therefore enables an analog injection value Vinj (not shown) to be injected to an analog Vo converted from a combined digital value $(1-z^{(-1)})*D$ by the DAC 1506, wherein the analog injection value Vinj is converted from the digital injection value $z^{(-1)}*D$. Symmetric to the first injection circuit 1502, the second injection circuit 1504 combines the digital injection value $-z^{(-1)}*D$ with the digital value Di to form the digital value Ds. The digital injection value $z^{(-1)}*D$ is formed by the least significant Ns bits of a digital value Ds' (not shown) which is formed by the second injection circuit 1504 in a previous cycle. The sum block 1530 is coupled to the DAC 1520 and the DAC 1506 for summarizing the analog values VoH and Vo to form the analog value Vot.

The DAC 1506 may include capacitors and/or register to store and combine the digital injection value $-z^{(-1)}*D$ and the digital value D sequentially loaded by the first injection circuit 1502. The DAC 1206 in the system 1200 of FIG. 12 is an example of the DAC 1506, and a DAC jointly implemented by the capacitor array 1260 and the peripheral circuit 1270 is an example of the DAC 1520. Similar to the system 1200, the system 1500 jointly adopts DEM (e.g., DWA) of pseudo-random shuffling and MES of symmetric injections.

Figures 16, 17A, 17B:
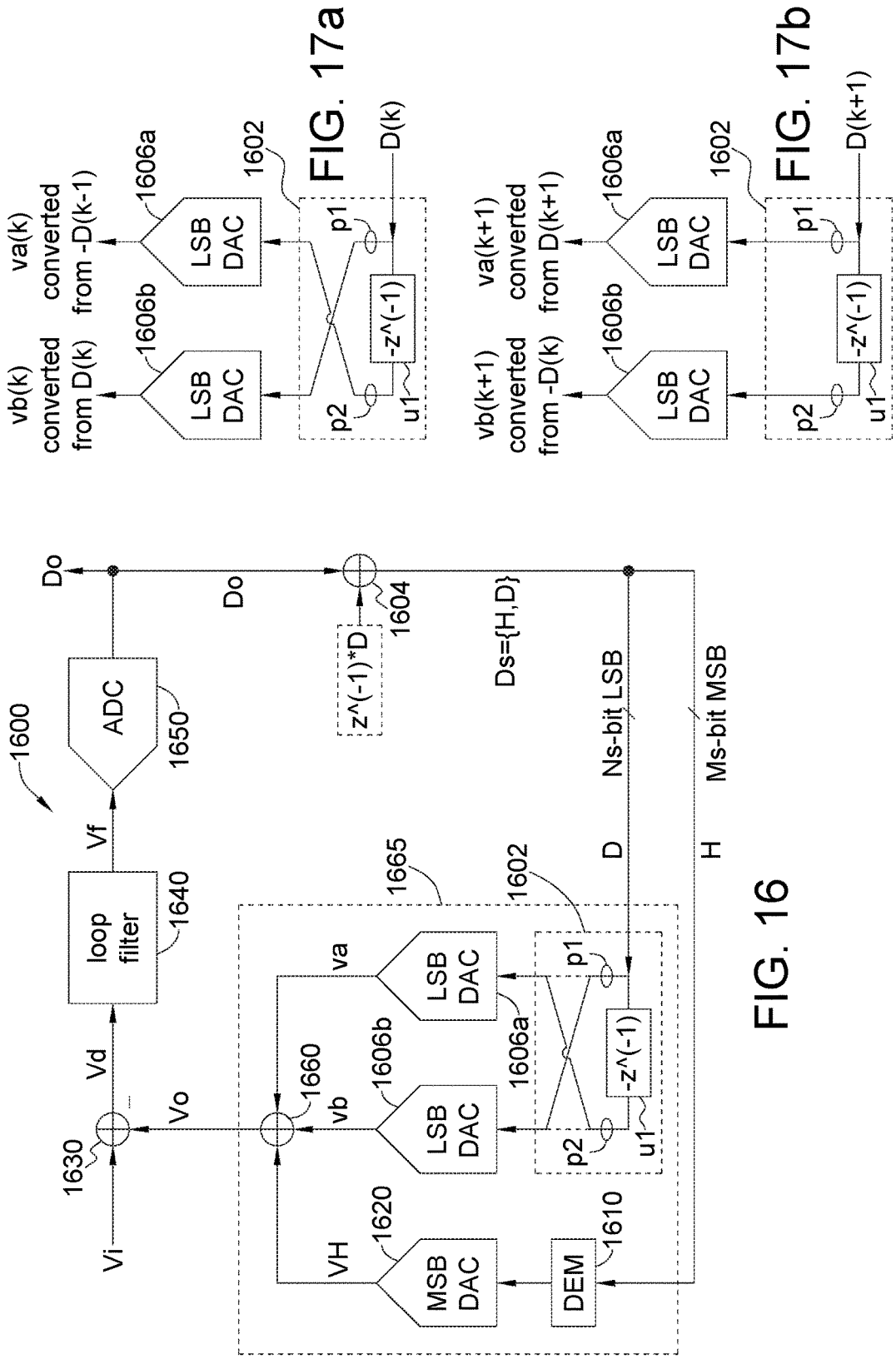
FIG. 16 illustrates a system according to an embodiment of the invention.
FIGS. 17a and 17b illustrate operations of the system shown in FIG. 16.

Please refer to FIG. 16 illustrating a system 1600 according to an embodiment of the invention. For example, the system 1600 may be adopted to implement a CT-DSM for modulating an analog value Vi to a digital value Do. The system 1600 includes a DAC block 1665, a sum block 1630, a loop filter 1640 (e.g., low-pass filter), an ADC 1650 and a second injection circuit 1604 modeled as a sum block. The DAC block 1665 includes a DEM circuit 1610, a first injection circuit 1602, a sum block 1660 and three DAC 1620, 1606a and 1606b respective function as an MSB DAC and two LSB DACs. The sum block 1630 subtracts an analog value Vo from the analog value Vi to form an analog value Vd. The loop filter 1640 is coupled between the sum block 1630 and the ADC 1650, for generating an analog value Vf by filtering the analog value Vd. The ADC 1650 is coupled between the loop filter 1640 and the second injection circuit 1604, for converting the analog value Vf to the digital value Do. The second injection circuit 1604 is coupled between the ADC 1650 and the DAC block 1665, for combining a digital injection value $z^{(-1)}*D$ with the digital value Do to form a digital value Ds. The DAC block 1665 is coupled between the sum block 1630 and the second injection circuit 1604, for converting the digital value Ds to the analog Vo.

For converting the digital value Ds, the digital value Ds is split to two digital values H and D, with the digital value H formed by the most significant Ms bits of the digital value Ds, and the digital value D formed by the least significant Ns bits of the digital value Ds. The DEM circuit 1610 codes the digital value H from binary code to thermometer code, and accordingly controls the DAC 1620 to synthesize an analog value VH converted from the digital value H. Mismatch error of the DAC 1620 is therefore shaped by DEM. On the other hand, the first injection circuit 1602 includes an operator u1 (e.g., a delay unit) coupled between two ports p1 and p2. The first injection circuit 1602 alternately routes the ports p1 and p2 to the DACs 1606a and 1606b, and the DACs 1606a and 1606b respectively generate analog values va and vb by converting the digital values routed by the first injection circuit 1602. The sum block 1660 combines the analog values VH, va and vb to form the analog value Vo.

Along with FIG. 16, please refer to FIGS. 17a and 17b illustrating operations of the first injection circuit 1602 at different cycles, wherein one of a sequence of the digital value D is converted at each cycle. For better understanding, the digital values D at different cycles are denoted by D(k−1), D(k) and D(k+1). As shown in FIG. 17a, in response to the digital value D(k) at a k-th cycle, the operator u1 provides the digital injection value $-z^{(-1)}*D(k)=-D(k-1)$ via the port p2, the digital value D(k) is received via the port p1; the first injection circuit 1602 routes the port p2 to the DAC 1606a to convert the digital injection value −D(k−1) to an analog value va(k) as an analog injection value, and concurrently routes the port p1 to the DAC 1606b to convert the digital value D(k) to an analog value vb(k), so as to enable the analog injection value va(k) to be injected to the analog value vb(k) by the sum block 1660 which combines the analog injection value va(k) and the analog value vb(k). Symmetrically, the second injection circuit 1604 injects the digital injection value D(k−1) in digital domain to achieve MES.

As shown in FIG. 17b, in response to the next digital value D(k+1) at a (k+1)-th cycle, the operator u1 provides a digital injection value $-z^{(-1)}*D(k+1)=-D(k)$ via the port p2, the digital value D(k+1) is received via the port p1; the first injection circuit 1602 routes the port p2 to the DAC 1606b to convert the digital injection value −D(k) to an analog value vb(k+1) as an analog injection value, and concurrently routes the port p1 to the DAC 1606a to convert the digital value D(k+1) to an analog value va(k+1), so as to enable the analog injection value vb(k+1) to be injected to the analog value va(k+1) by the sum block 1660 which combines the analog injection value vb(k+1) and the analog value va(k+1). Symmetrically, the second injection circuit 1604 injects the digital injection value D(k) in digital domain to achieve MES. Note that MES is not only achieved between the DACs 1606a and 1606b at each cycle, but also achieved among different cycles for each of the DACs 1606a and 1606b.

As explained by FIGS. 17a and 17b, at each cycle, one of the analog values va and vb is the analog injection value converted from the digital injection value $-z^{(-1)}*D$ to be injected to the analog value Vo. Because the analog values va and vb are generated concurrently, each of the DACs 1606a and 1606b does not have to store the digital injection value $-z^{(-1)}*D$ to be combined with the digital value D, unlike the DAC 1506 shown in FIG. 15. The DACs 1606a and 1606b can therefore be implemented by NRZ (non-return to zero) current DAC.

Figure 18:
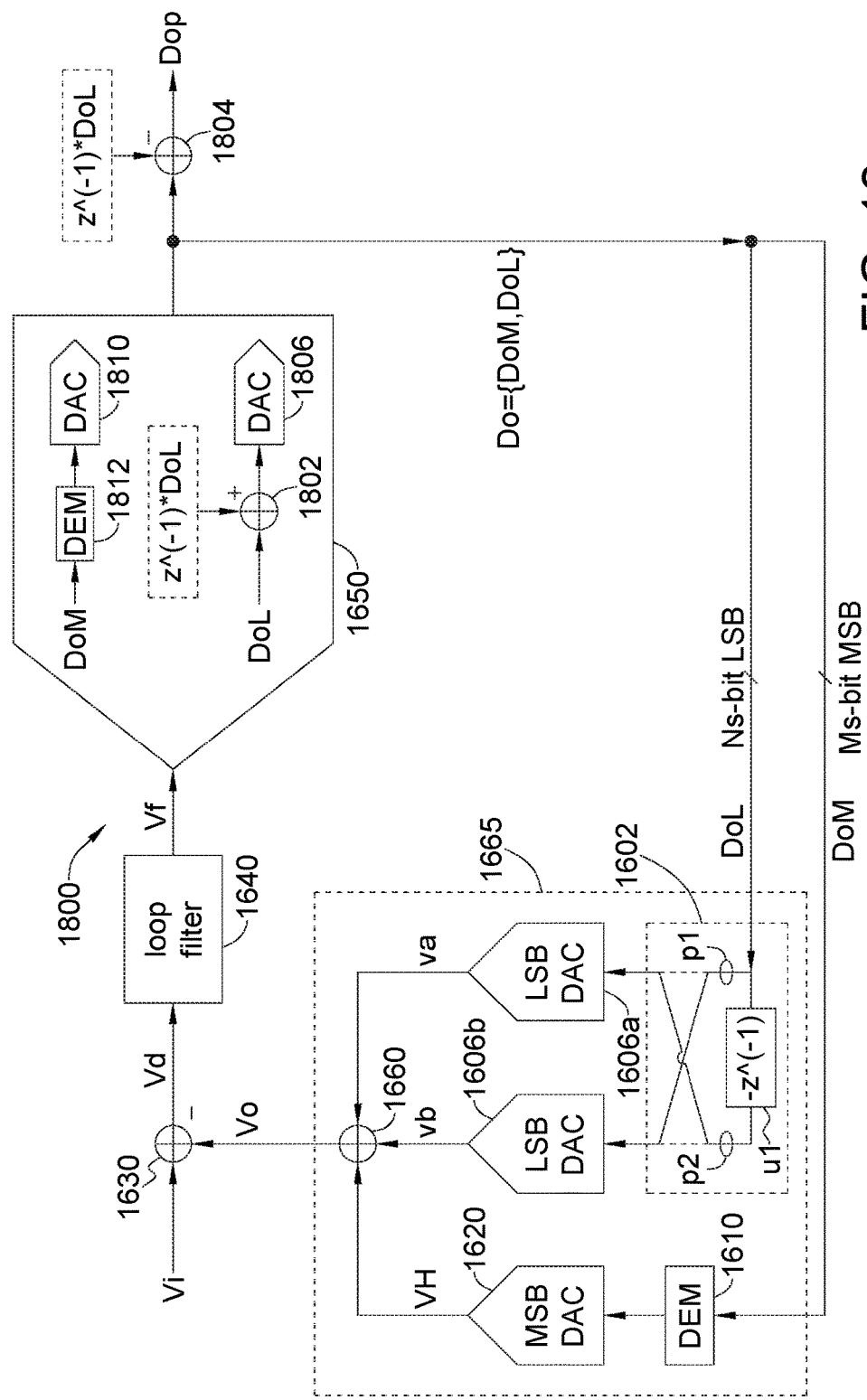
FIG. 18 illustrates a system according to an embodiment of the invention.

Please refer to FIG. 18 illustrating a system 1800 according to an embodiment of the invention which receives an analog value Vi and outputs a digital value Dop converted from the analog value Vin. The system 1800 is modified from the system 1600 (FIG. 16), and includes the sum block 1630 for subtracting the analog value Vo from the analog value Vi to form the analog value Vd, the loop filter 1640 for generating the analog Vf, the ADC 1650 for converting the analog value Vf to the digital value Do, and the DAC block 1665 for converting the digital value Do to the analog value Vo. The digital value Do of Ns+Ms bits is split to two digital values DoM and DoL respectively formed by the most significant Ms bits and the least significant Ns bits of the digital value Do.

In the system 1800, the ADC 1650 includes a DAC 1806 as an LSB DAC, a DAC 1810 as an MSB DAC, a DEM circuit 1812 coupled to the DAC 1810, and a first injection circuit 1802. For example, the ADC 1650 may be implemented by the system 1200 shown in FIG. 12, with the DAC 1806 implemented by the DAC 1206 for determining the digital value DoL, the DEM circuit 1812 implemented by the DEM circuit 1280, the DAC 1810 jointly implemented by the capacitor array 1260 and the peripheral circuit 1270 for determining the digital value DoM with DEM, and the first injection circuit 1802 implemented by the first injection circuit 1202. The DEM circuit 1812 controls the DAC 1810 to synthesize an analog value (not shown) converted from the digital value DoM. The first injection circuit 1802 enables an analog value Vinj (not shown) to be injected in analog domain by loading a digital injection value $z\hat{}(-1)$*DoL with the digital value DoL to the DAC 1806. Symmetric to the first injection circuit 1802, the system 1800 further includes a second injection circuit 1804 for combining the digital injection value $z\hat{}(-1)$*DoL with the digital value D to form the digital value Dop. In other words, while the mismatch error of the DAC block 1665 can be shaped by cooperation of DEM and MES, the mismatch error of the ADC 1650 can also be shaped by cooperation of DEM and MES with the system 1800. Cooperation of the injection circuits 1802 and 1804 also implement function of the injection circuit 1604.

Figure 19:
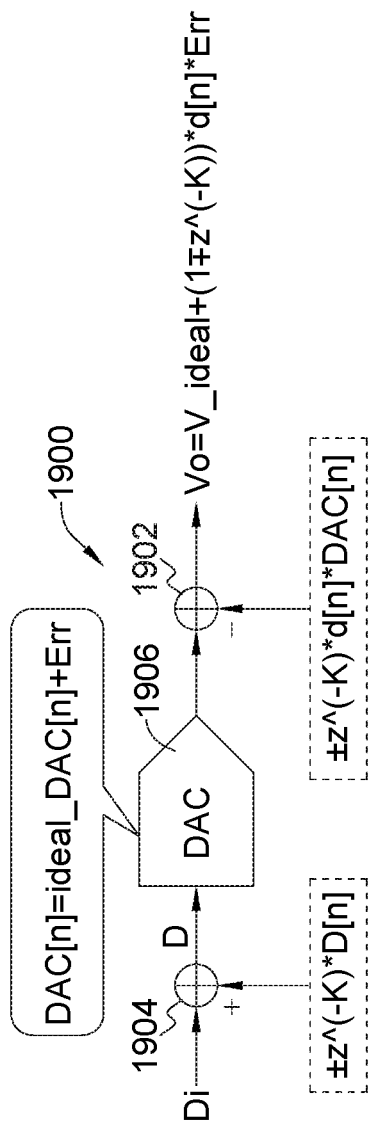
FIG. 19 illustrates a system according to an embodiment of the invention.

Please refer to FIG. 19 illustrating a system 1900 according to an embodiment of the invention. The system 1900 receives a digital value Di and outputs an analog value Vo converted from the digital value Di. Similar to the system 600 shown in FIG. 6a, the system 1900 includes a first injection circuit 1902, a second injection circuit 1904 and a DAC 1906; when the DAC 1906 generates the analog value Vo, the first injection circuit 1902 enables an analog injection value to be injected to the analog value Vo, and the second injection circuit 1904 combines an digital injection value with the digital value Di to form a digital value D. However, in the system 1900, the analog injection value and digital injection value injected for MES are modified. As shown in FIG. 19, for shaping mismatch error due to converting a bit d[n] of the digital value D, the digital injection value injected by the second injection circuit 1904 can be generalized as $\pm z\hat{}(-K)$*D[n] with D[n] formed by the bit d[n], and the analog injection value injected by the first injection circuit 1902 can be generalized as $\pm z\hat{}(-K)$*d[n]*DAC[n] with DAC[n] converted from D[n], wherein K is an integer not limited to 1. In other words, the operator $z\hat{}(-1)$ for "delaying one cycle" can be replaced by the operator $z\hat{}(-K)$ for "delaying K cycle," or $-z\hat{}(-K)$.

Figure 20:
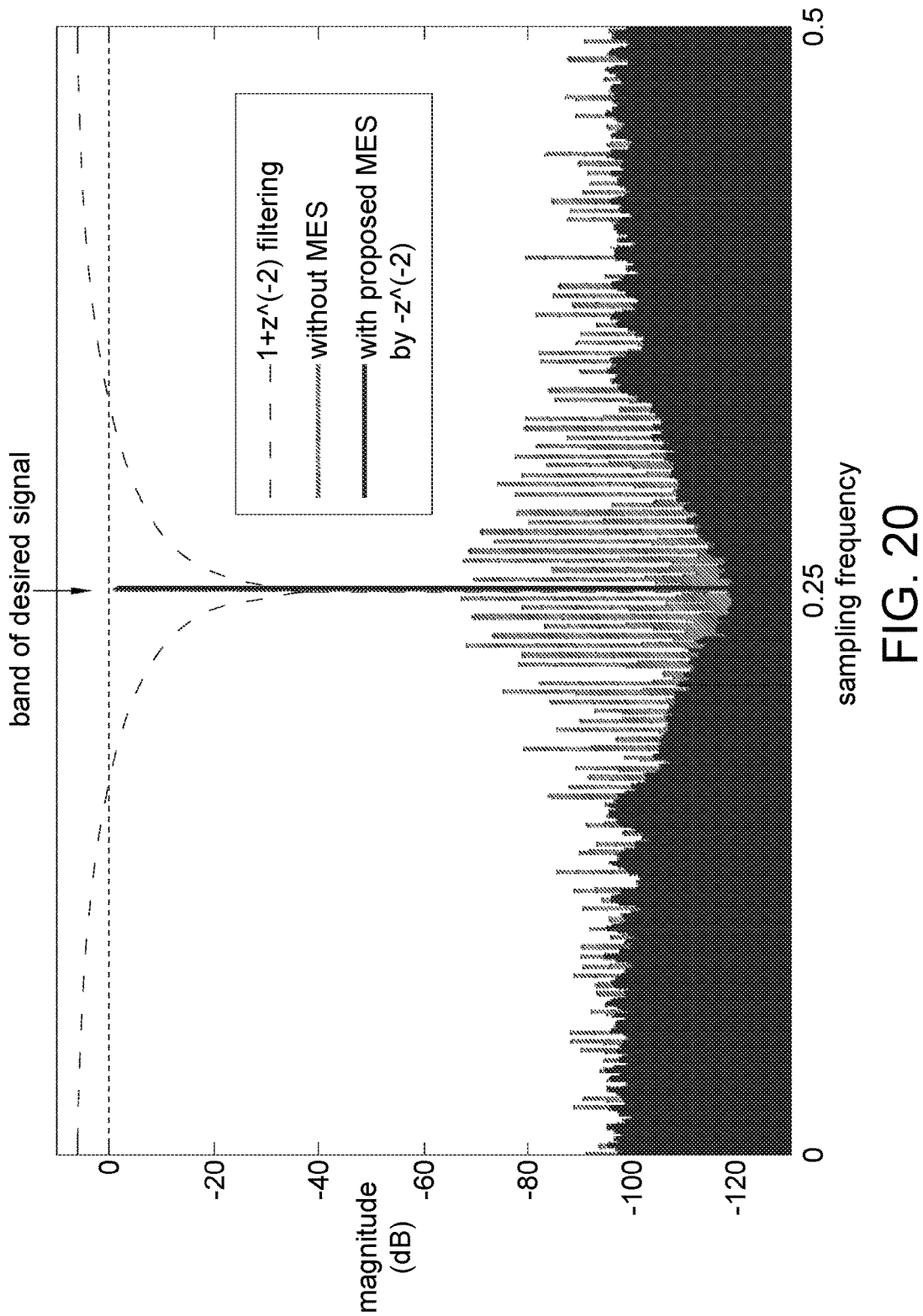
FIG. 20 illustrates exemplified performance of the system shown in FIG. 19.

By MES with the operator $\pm z\hat{}(-K)$, original mismatch error d[n]*Err for converting the bit d[n] will be shaped to $(1 \mp z\hat{}(-K))$*d[n]*Err. By changing value of the integer K and the sign, various shaping effects can be achieved. Please refer to FIG. 20 which compares output spectrums with and without proposed MES of the invention, wherein the operator $\pm z\hat{}(-K)$ for implementing the propose MES is chosen to be $-z\hat{}(-2)$, thus mismatch error will be shaped by $1+z\hat{}(-2)$. FIG. 20 also shows a frequency domain response of a filter $1+z\hat{}(-2)$. As shown in FIG. 20, the spectrum without MES suffers obvious spurs near band of desired signal; on the contrary, the spectrum with proposed MES successfully suppresses spurs near band of desired signal.

In other words, by manipulating the operator $\pm z\hat{}(-K)$, MES according to the invention has sufficient flexibility to achieve different shaping effects, such as those shown in FIG. 11 and FIG. 20. Such flexibility enables the proposed MES applicable to different applications. For example, some kinds of communication systems down-convert RF signals to IF signals to be digitized, then MES exemplified by FIG. 20 can be adopted. Other kinds of communication systems down-convert RF signals to baseband to be digitized, the MES exemplified by FIG. 11 can be adopted.

Figure 1:
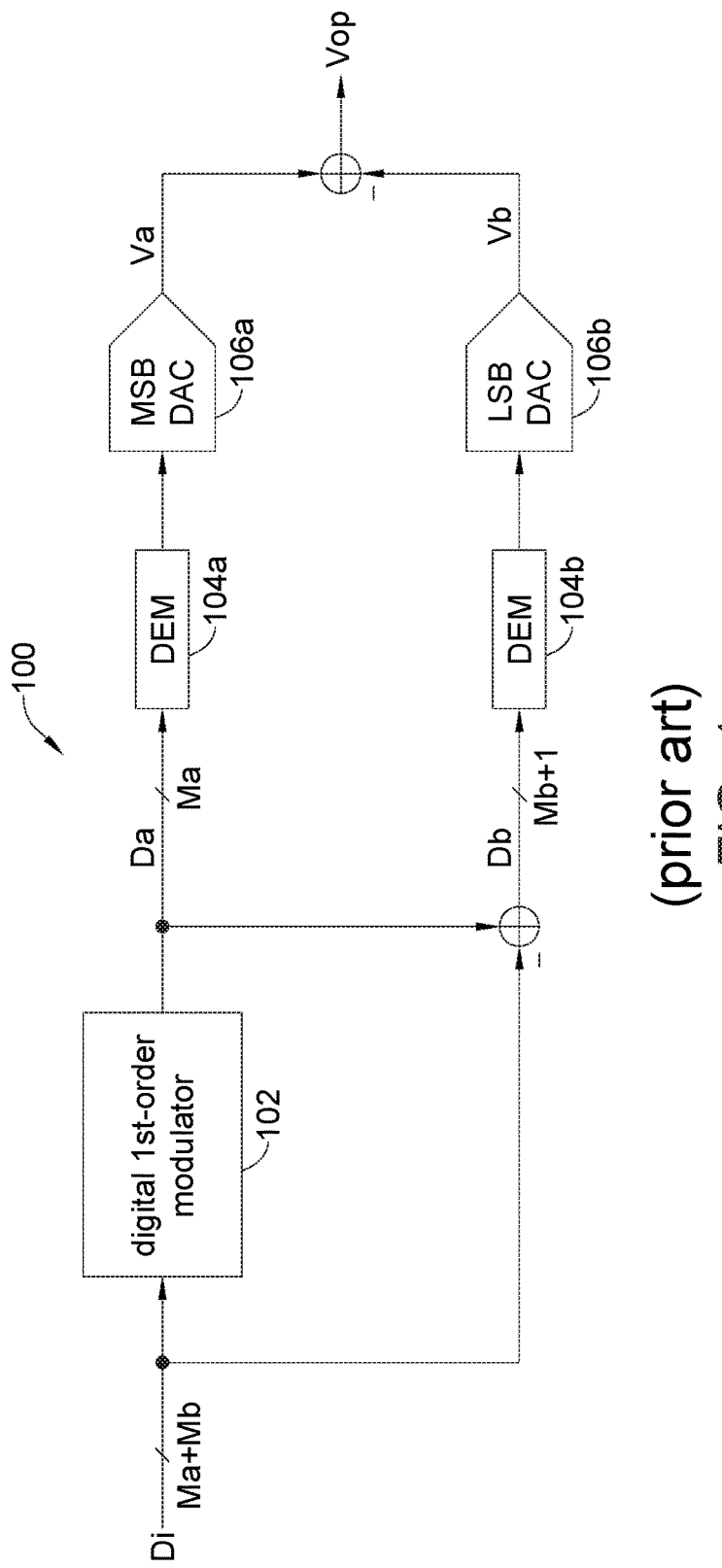
FIG. 1 (prior art) illustrates a prior art DAC system.

To sum up, the invention provides MES implemented by injections in both analog and digital domains. Comparing to the prior arts (e.g., FIG. 1) which is not applicable to SAR ADC and high-speed CT-DSM, the proposed the invention provides mismatching shaping solutions of high performance, low power and compact area for SAR ADC (e.g., FIG. 9 or 12) and CT-DSM (e.g., FIG. 16 or 18). For SAR ADC, the invention can break linearity limitation of SAR ADC to provide high quantization resolution. For CT-DSM, the invention enables highly multi-bit quantization, and therefore lowers OSR (over-sampling rate). MES according to the invention is applicable to ADC/DAC of arbitrary weighted elements (e.g., capacitors or current sources), not limited to binary weighted elements. The invention also provides flexibility to implement different shaping effects.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A system for conversion between analog domain and digital domain with mismatch error shaping, receiving a first input analog value and outputting a first output digital value converted from the first input analog value during a first cycle, and receiving a second input analog value and outputting a second output digital value converted from the second input analog value during a second cycle, and comprising:

a DAC (digital-to-analog converter) generating a first analog value in response to a first digital value, and generating a second analog value in response to a second digital value;

a first injection circuit coupled to the DAC, enabling an analog injection value to be injected to the second analog value when the DAC generates the second analog value, wherein the analog injection value is converted from a digital injection value formed by a subset of bits of the first digital value, and a second injection circuit coupled to the DAC, for injecting the digital injection value to the second digital value; and a register, wherein the first injection circuit comprises an additional control circuit coupled to the register, and the DAC comprises:

a peripheral circuit coupled to the register; and a plurality of capacitors, each of the capacitors having a top terminal coupled to a common node, and a bottom terminal coupled to the peripheral circuit, wherein during a first phase of the second cycle, the additional control circuit controls the register to register the subset of bits of the first digital value, and controls the peripheral circuit to conduct the bottom terminals of the capacitors to voltages reflecting the subset of bits of the first digital value, and to conduct the common node to the second input analog value, so as to enable the analog injection value to be injected, and during a second phase of the second cycle after the first phase, the peripheral circuit conducts the bottom terminals of the capacitors to a reset voltage, and the register resets.

2. The system of claim 1 further comprising:
a comparator coupled to the common node and the register, wherein during a period of the second cycle, the comparator compares a voltage at the common node to set a bit of the register.

3. The system of claim 1 further comprising:
a second register,
a DEM (dynamic element matching) circuit coupled to the second register,
a second peripheral circuit coupled to the DEM circuit, and
a plurality of second capacitors, each of the second capacitors having a top terminal coupled to the common node, and a bottom terminal coupled to the second peripheral circuit;
wherein during the first phase and the second phase of the second cycle, the second peripheral circuit conducts the bottom terminals of the second capacitors to the reset voltage, and
during a third phase of the second cycle, the DEM circuit selects a number of the second capacitors with the number reflecting bits registered by the second register, and the second peripheral circuit conducts the bottom terminals of the selected second capacitors to a setting voltage.

4. A system for conversion between analog domain and digital domain with mismatch error shaping, comprising:
a DAC generating a first analog value in response to a first digital value during a first cycle, and generating a second analog value in response to a second digital value during a second cycle; wherein the system receives an input digital value and outputs an output analog value during the second cycle, and the second digital value is formed by a second subset of the bits of a combined value,
a first injection circuit coupled to the DAC, enabling an analog injection value to be injected to the second analog value when the DAC generates the second analog value, wherein the analog injection value is converted from a digital injection value formed by a subset of bits of the first digital value, and the first injection circuit sequentially loads the digital injection value and the second digital value to the DAC during different periods of the second cycle, so as to enable the analog injection value to be injected;
a second injection circuit coupled to the DAC, for combining the digital injection value and the input digital value to form the combined value;
a second DAC,
a DEM circuit coupled between the second injection circuit and the second DAC, for receiving an internal digital value formed by a first subset of bits of the combined value, coding the internal digital value from binary code to thermometer code, and accordingly controlling the second DAC to synthesize an internal analog value, and
a sum block coupled between the DAC and the second DAC for combining the internal analog value and the second analog value to form the output analog value.

5. A system for conversion between analog domain and digital domain with mismatch error shaping, comprising:
a DAC generating a first analog value in response to a first digital value, and generating a second analog value in response to a second digital value;
a first injection circuit coupled to the DAC, enabling an analog injection value to be injected to the second analog value when the DAC generates the second analog value, wherein the analog injection value is converted from a digital injection value formed by a subset of bits of the first digital value;
a second injection circuit coupled to the DAC, for combining the digital injection value and a related value obtained according to the second analog value;
a second DAC coupled to the first injection circuit, and
a sum block coupled to the DAC and the second DAC,
wherein the first injection circuit comprises an operator coupled between a first port and a second port;
during a first cycle, the operator provides the digital injection value via the second port, the second digital value is received via the first port, the first injection circuit routes the second port to the second DAC to convert the digital injection value to the analog injection value, and routes the first port to the DAC to convert the second digital value to the second analog value, so as to enable the analog injection value to be injected to the second analog value by the sum block which combines the analog injection value and the second analog value.

6. The system of claim 5, wherein during a second cycle, the operator provides a second digital injection value via the second port, a subsequent digital value is received via the first port, the first injection circuit routes the second port to the DAC to convert the second digital injection value to a second analog injection value, and routes the first port to the second DAC to convert the subsequent digital value to a subsequent analog value, so as to enable the second analog injection value to be injected to the subsequent analog value by the sum block which combines the second analog injection value and the subsequent analog value, wherein the second digital injection value is formed by a subset of bits of the second digital value.

7. A system for conversion between analog domain and digital domain with mismatch error shaping, comprising:
a DAC generating a first analog value in response to a first digital value, and generating a second analog value in response to a second digital value;
a first injection circuit coupled to the DAC, enabling an analog injection value to be injected to the second analog value when the DAC generates the second analog value, wherein the analog injection value is converted from a digital injection value formed by a subset of bits of the first digital value;
a second injection circuit coupled to the DAC, for combining the digital injection value and a related value obtained according to the second analog value;
a second DAC coupled to the first injection circuit, wherein the analog injection value is converted by the second DAC;
a third DAC, a sum block coupled to the DAC, the second DAC and the third DAC; and a DEM circuit coupled to the third DAC, for receiving an internal digital value, coding the internal digital value from binary code to thermometer code, and accordingly controlling the third DAC to synthesize an internal analog value, wherein the internal digital value and the second digital value are respectively formed by different subsets of bits of a third digital value, and the sum block combines the analog injection value, the second analog value and the internal analog value to form a third analog value.

8. The system of claim 7 receiving an input analog value and outputting an output digital value converted from the input analog value, and further comprising:

a loop filter coupled to the sum block, for filtering a difference between the input analog value and the third analog value to generate a filtered analog value, and an ADC coupled between the loop filter and the second injection circuit for converting the filtered analog value to the output digital value, wherein the second injection circuit is arranged to combine the digital injection value and the related value, which is the output digital value, to form the third digital value.

9. The system of claim 7 receiving an input analog value and outputting an output digital value converted from the input analog value, and further comprising:

a loop filter coupled to the sum block, for filtering a difference between the input analog value and the third analog value to generate a filtered analog value, and an ADC coupled between the loop filter and the second injection circuit for converting the filtered analog value to the third digital value, wherein the second injection circuit is arranged to combine the digital injection value and the related value, which is the third digital value, to form the output digital value.

10. The system of claim 9, wherein the ADC comprises:

an inner injection circuit for combining the digital injection value and the second digital value, and an inner DAC for converting the combined result of the inner injection circuit.

11. The system of claim 10, wherein the ADC further comprises:

a second inner DAC for converting the internal digital value.

12. The system of claim 10, wherein the inner injection circuit and the second injection circuit combine the digital injection value with different signs.

* * * * *